(12) United States Patent
Nonaka et al.

(10) Patent No.: US 10,600,360 B2
(45) Date of Patent: Mar. 24, 2020

(54) DISPLAY DEVICE AND METHOD OF DESIGNING THE SAME

(71) Applicant: TIANMA JAPAN, LTD., Kawasaki, Kanagawa (JP)

(72) Inventors: Yoshihiro Nonaka, Kawasaki (JP); Yojiro Matsueda, Kawasaki (JP); Kenichi Takatori, Kawasaki (JP)

(73) Assignee: TIANMA MICROELECTRONICS CO., LTD., Longhua District, Chenzhen (CN)

( * ) Notice: Subject to any disclaimer, the term of this patent is extended or adjusted under 35 U.S.C. 154(b) by 0 days.

(21) Appl. No.: 16/034,632

(22) Filed: Jul. 13, 2018

(65) Prior Publication Data

US 2019/0027090 A1 Jan. 24, 2019

(30) Foreign Application Priority Data

Jul. 20, 2017 (JP) .................................. 2017-140420
Apr. 12, 2018 (JP) .................................. 2018-076768

(51) Int. Cl.
*G09G 3/3225* (2016.01)
*H01L 27/32* (2006.01)
(Continued)

(52) U.S. Cl.
CPC ....... *G09G 3/3225* (2013.01); *G02F 1/13454* (2013.01); *G09G 3/3233* (2013.01); *H01L 27/326* (2013.01); *G09G 2300/0439* (2013.01); *G09G 2300/0842* (2013.01); *G09G 2330/02* (2013.01); *H01L 27/3276* (2013.01)

(58) Field of Classification Search
CPC . H01L 27/326; H01L 27/3276; G09G 3/3648; G09G 3/3208; G09G 3/36; G09G 3/3233; G09G 3/3225; G09G 3/3677; G09G 3/3688; G09G 3/3275; G09G 2300/0426; G09G 2300/0408; G09G 2310/0281; G09G 2310/0232; G09G 2310/0262; G09G 2310/027; G09G 2330/02; G02F 1/13454
See application file for complete search history.

(56) References Cited

U.S. PATENT DOCUMENTS 9,626,900 B2 * 4/2017 Anzai .................. G09G 3/3225
9,837,022 B2 12/2017 Lee et al.
(Continued)

FOREIGN PATENT DOCUMENTS

JP 2015-203870 A 11/2015

*Primary Examiner* — Xuemei Zheng
(74) *Attorney, Agent, or Firm* — Sughrue Mion, PLLC

(57) ABSTRACT

Column circuit blocks and row circuit blocks include circuit block units each being opposed to a step of the series of steps. Each of the circuit block units consists of m column circuit blocks and n row circuit blocks disposed side by side along a virtual line connecting outer vertices of the opposite step in an order corresponding to an order of pixel rows and pixel columns of the opposite step. A total sum of lengths of sides of the m column circuit blocks opposed to the virtual line projected to the virtual line and lengths of sides of the n row circuit blocks opposed to the virtual line projected to the virtual line is not greater than the virtual line length. A power line is provided outer than the display region and between the display region and the row circuit blocks and the column circuit blocks.

15 Claims, 16 Drawing Sheets

(51) Int. Cl.
*G09G 3/3233* (2016.01)
*G02F 1/1345* (2006.01)

(56) References Cited

U.S. PATENT DOCUMENTS

| | | | |
|---|---|---|---|
| 2010/0141570 A1* | 6/2010 | Horiuchi | G09G 3/3611 345/100 |
| 2012/0001835 A1* | 1/2012 | Yamamoto | G02F 1/13454 345/55 |
| 2015/0294985 A1 | 10/2015 | Hekstra | |
| 2015/0355487 A1* | 12/2015 | Emmert | G02F 1/13306 349/33 |
| 2016/0240141 A1* | 8/2016 | Lee | G02F 1/13454 |

\* cited by examiner

DISPLAY DEVICE AND METHOD OF DESIGNING THE SAME

CROSS-REFERENCE TO RELATED APPLICATIONS

The present application claims priority from Japanese patent application JP2017-140420 filed on Jul. 20, 2017 and Japanese patent application JP2018-076768 filed on Apr. 12, 2018, the contents of which are hereby incorporated by reference into this application.

BACKGROUND

This disclosure relates to a display device and a method of designing the same.

Traditional display devices usually have a rectangular display region. Recently, non-rectangular display regions, particularly circular display regions have come to be employed for watch-type mobile displays or vehicle displays in view of the appearance or the size of the display region. For example, JP 2015-203870 A discloses various shapes of non-rectangular display regions.

The peripheral circuit inclusive of a scanning circuit and a data circuit includes a plurality of TFTs, which are embedded in the outside of the display region or the peripheral area of the display panel. In the case where the display region has a rectangular shape, the scanning circuit and the data circuit are provided along different sides of the rectangular display region.

In the case where a display device has a non-rectangular display region, the display device may have a region where both of the scanning circuit and the data circuit are disposed. To dispose circuits having different functions within the region, the layout of the lines and circuit elements in the region is complicated. Furthermore, the scanning circuit and the data circuit are disposed in two layers (rows) in the direction away from the center of the display region, resulting in a wide bezel.

For example, the example disclosed in JP 2015-203870 A employs a circuit arrangement such that a common voltage part, a signal line driving circuit, and a scanning line driving circuit are disposed in layers in the radial direction of the display region. The line (circuit) layout needs to be carefully considered to avoid crossing of the signal lines, the scanning lines, and the common voltage part on the same layer, so that the bezel is wide.

SUMMARY

An aspect of the disclosure is a display device including: a display region including a plurality of pixel columns and a plurality of pixel rows; a plurality of row circuit blocks and a plurality of column circuit blocks disposed side by side along the boundary of the display region; and a first power line configured to supply electric power to pixels in the display region, wherein each of the plurality of row circuit blocks is configured to supply a first signal to a pixel row associated therewith, wherein each of the plurality of column circuit blocks is configured to supply a second signal to a pixel column associated therewith, wherein the perimeter of the display region includes a series of steps each including sides of a plurality of pixels, wherein each step of the series of steps is defined by pixels in m pixel columns and pixels in n pixel rows, n and m each being a variable to take a natural number determined depending on the step, wherein the plurality of column circuit blocks and the plurality of row circuit blocks include a plurality of circuit block units each being opposed to a step of the series of steps, wherein each of the plurality of circuit block units consists of m column circuit blocks and n row circuit blocks disposed side by side along a virtual line connecting outer vertices of the opposite step in an order corresponding to an order of pixel rows and pixel columns of the opposite step, wherein a total sum of lengths of sides of the m column circuit blocks opposed to the virtual line that are projected to the virtual line and lengths of sides of the n row circuit blocks opposed to the virtual line that are projected to the virtual line is equal to or shorter than a length of the virtual line, and wherein the first power line is provided outer than the display region and between the display region and the plurality of row circuit blocks and the plurality of column circuit blocks.

It is to be understood that both the foregoing general description and the following detailed description are exemplary and explanatory and are not restrictive of this disclosure.

EMBODIMENTS

Hereinafter, embodiments of this invention will be described with reference to the accompanying drawings. It should be noted that the embodiments are merely examples to implement this invention and are not to limit the technical scope of this invention. Throughout the drawings, common elements are denoted by the same reference signs.

Configuration of Display Device

Figure 1A:
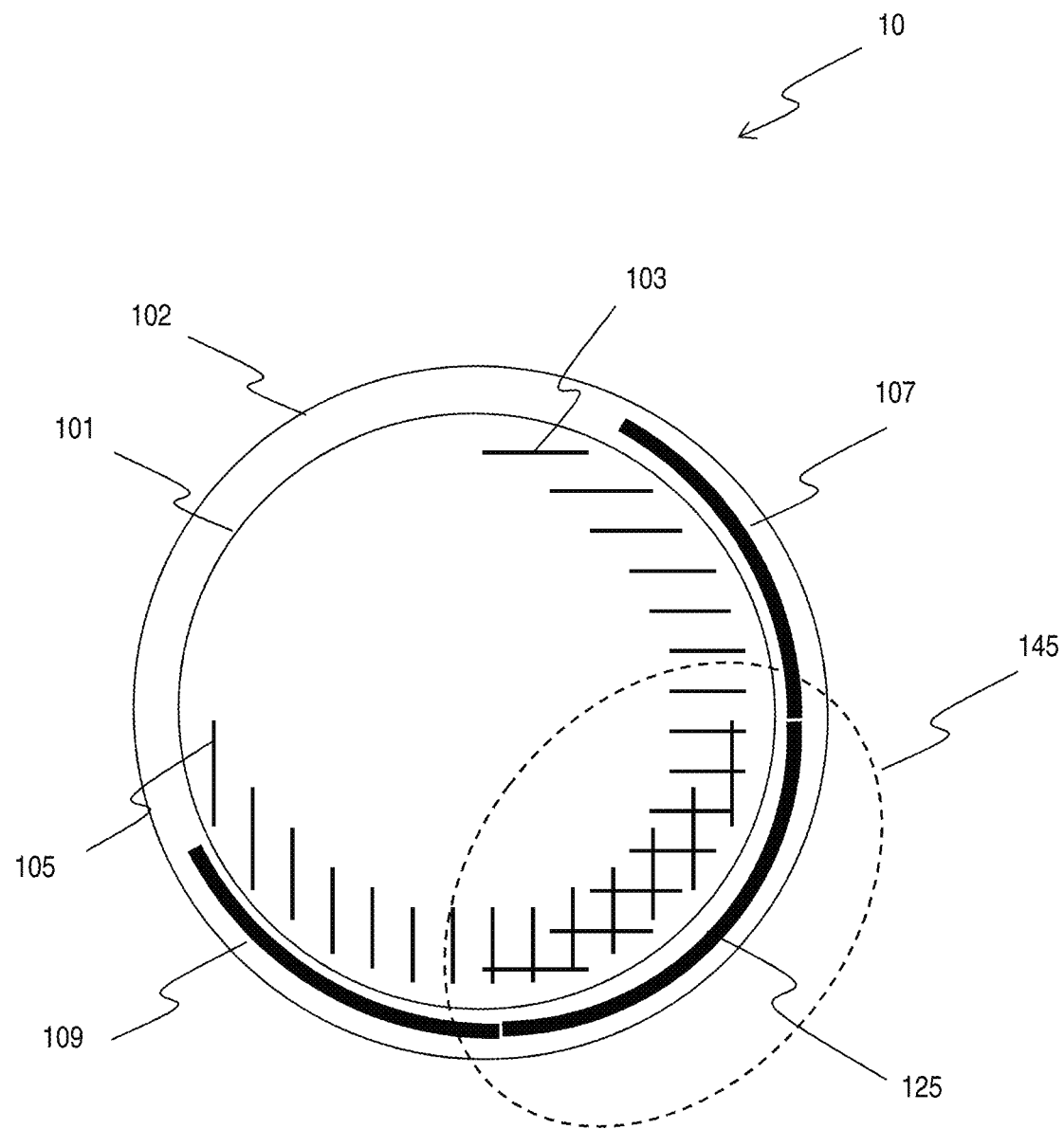
FIG. 1A schematically illustrates a configuration example of a display device in an embodiment.

FIG. 1A schematically illustrates a configuration example of a display device in an embodiment. The display device 10 in this disclosure has a non-rectangular display region. The term rectangle includes square. The term non-rectangle means shapes other than rectangle (quadrangle), such as circle, oval, star, and heart. In the example of FIG. 1A, the display region (display part 101) has a circular shape. The display region is composed of pixels arrayed in a matrix. One pixel may consist of a sub-pixel or sub-pixels for one color or a plurality of sub-pixels for different colors. In the example described hereinafter, one pixel consists of sub-pixels for three colors of red, green, and blue.

The display device 10 includes a display part 101 and a peripheral circuit fabricated on a substrate 102. The peripheral circuit controls the sub-pixels (pixels) in the display part 101. The display part 101 includes scanning lines 103 and data lines 105 for transmitting signals to circuits (pixel circuits) for controlling individual sub-pixels. As understood from this description, the display device 10 in this example is an active-matrix display device. In the example of FIG. 1, the scanning lines 103 are disposed to extend in the horizontal direction and to be distant from one another in the vertical direction and the data lines 105 are disposed to extend in the vertical direction and to be distant from one another in the horizontal direction.

An example of the sub-pixel is a sub-pixel for a liquid crystal display device, including electrodes opposed to each other, liquid crystal provided between the electrodes, and a color filter. A liquid crystal display device displays a desired image by controlling the transmitted amount of light emitted from a backlight through each sub-pixel. The transmitted amount is controlled by a driving transistor. Another example of the sub-pixel is a sub-pixel for an organic light-emitting diode (OLED) display device, including electrodes opposed to each other and an organic light-emitting layer between the electrodes. An OLED display device displays a desired image by controlling the intensity of light emission of each sub-pixel. The features of this disclosure are applicable to any type of display devices. As to the OLED display device, detailed description will be provided with the drawings following FIG. 10A.

An example of a pixel circuit for controlling a sub-pixel includes one or more thin film transistors (TFTs). The TFTs can be polysilicon TFTs. Each scanning line 103 selects a plurality of sub-pixels connected with the scanning line 103 from the sub-pixels in the display region. Each data line 105 provides a signal specifying the intensity of light to the pixel circuit of the sub-pixel selected by a scanning line 103 among the sub-pixels connected with the data line 105.

The peripheral circuit is provided in an are along the perimeter of the display part 101. The peripheral circuit is directly mounted on the substrate 102 by a semiconductor fabrication process. The peripheral circuit includes a scanning circuit for providing a signal (so-called scanning signal) to the scanning lines 103 and a data circuit for providing a signal (so-called data signal) to the data lines 105. In the example of FIG. 1A, the peripheral circuit is separated into three parts.

A circuit part 107 includes only scanning circuits. A circuit part 109 includes only data circuits. A circuit part 125 is provided between the circuit part 107 and the circuit part 109 along the perimeter of the display part 101 and includes scanning circuits and data circuits.

Figure 1B:
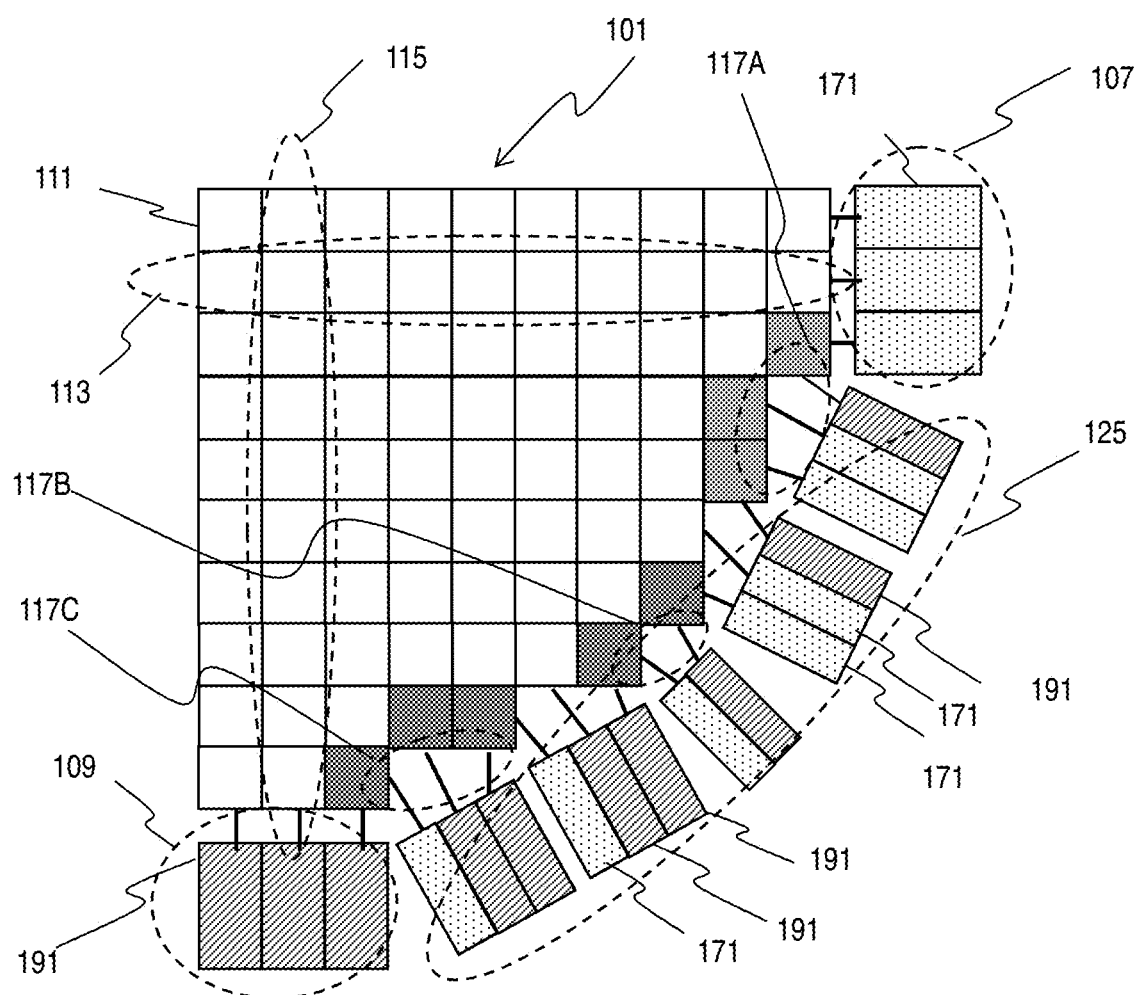
FIG. 1B illustrates details of an area including a circuit part of the display device shown in FIG. 1A.

FIG. 1B illustrates details of an area 145 including the circuit part 125 of the display device 10 shown in FIG. 1A. The display part 101 includes a plurality of pixels 111 arrayed in a matrix. The display part 101 includes a plurality of pixel rows 113 and a plurality of pixel columns 115. Each pixel row 113 consists of pixels 111 disposed in the horizontal direction in FIG. 1B and each pixel column 115 consists of pixels 111 disposed in the vertical direction in FIG. 1B.

The rough ranges of a part of the circuit part 107, a part of the circuit part 109, and the circuit part 125 are indicated by dashed lines. The circuit part 107 consists of a plurality of scanning circuit blocks 171 disposed side by side along the perimeter of the display part 101. FIG. 1B includes three of the scanning circuit blocks 171 in the circuit part 107. In FIG. 1B, only some of the scanning circuit blocks are indicated with reference signs 171.

The circuit part 109 consists of a plurality of data circuit blocks 191 disposed side by side along the perimeter of the display part 101. FIG. 1B includes three of the data circuit blocks 191 in the circuit part 109. In FIG. 1B, only some of the data circuit blocks are indicated with reference signs 191.

The circuit part 125 consists of a plurality of scanning circuit blocks 171 and a plurality of data circuit blocks 191 disposed side by side along the perimeter of the display part 101. Within the circuit part 125, sets consisting of one or more scanning circuit blocks 171 and sets consisting of one or more data circuit blocks 191 are disposed alternately.

In the example of the circuit part 125 in FIG. 1B, one data circuit block 191, two scanning circuit blocks 171, one data circuit block 191, two scanning circuit blocks 171, one data circuit block 191, one scanning circuit block 171, two data circuit blocks 191, one scanning circuit block 171, two data circuit blocks 191, and one scanning circuit block 171 are disposed in this order.

The circuit part 125 is opposed to a step-like section of the perimeter of the display part 101 (display region). The step-like section is composed of a series of steps. In the example of FIG. 1B, the step-like section consists of five steps; three of the steps are indicated with reference signs 117A, 117B, and 117C.

Each step is defined by pixels located on the perimeter (end) of the display part 101. In other words, each step is formed of sides of pixels. Specifically, one step is defined by the pixels at ends of n pixel rows and the pixels at ends of m pixel columns. Each of n and m is a natural number. In other words, a step is defined by n pixel rows and m pixel columns and is formed of end sides of the n pixel rows and end sides of the m pixel columns. The end side is a side perpendicular to the direction in which the pixel row or pixel column extends.

Whether a pixel defining a part of a step belongs to a row or a column depends on the side of the pixel forming the step, or the side exposed to the space. If the side is an end side in the row direction, the pixel belongs to the pixel column; if the side is an end side in the column direction, the pixel belongs to the pixel row.

In this example, the scanning lines 103 extend in the row direction and the data lines 105 extend in the column direction. If the scanning line of a pixel is exposed at the step (to the space), it is considered that the pixel belongs to a pixel row at the step. If the data line of a pixel is exposed at the step (to the space), it is considered that the pixel belongs to a pixel column at the step.

For example, the step 117A is defined by three pixels 111 (see the shaded pixels), specifically, one pixel belonging to a column and two pixels belonging to rows. The step 117B is defined by two pixels 111 (see shaded pixels), specifically, one pixel belonging to a column and one pixel belonging a row. The step 117C is defined by three pixels 111 (see the shaded pixels), specifically, two pixels belonging to columns and one pixel belonging to a row.

Each circuit block facing a step supplies a signal to the pixel row or pixel column defining the step. A scanning circuit block 171 is connected with the scanning line for a pixel row associated with the step and supplies a signal to the pixel row connected with the scanning line. A data circuit block 191 is connected with three data lines for a pixel column associated with the step and supplies signals to the pixel column connected with the data lines.

As illustrated in FIG. 1B, the order of disposition of the pixel rows and pixel columns defining a step corresponds to the order of scanning circuit blocks 171 and data circuit blocks 191 associated therewith. For example, the step 117A is defined by a column, a row, and a row disposed in this order. The associated (opposite) circuit blocks are a data circuit block 191, a scanning circuit block 171, and a scanning circuit block 171 disposed side by side in this order.

The step 117B is defined by a column and a row disposed in this order. The associated (opposite) circuit blocks are a data circuit block 191 and a scanning circuit block 171 disposed side by side in this order. The step 117C is defined by a column, a column, and a row disposed in this order. The associated (opposite) circuit blocks are a data circuit block 191, a data circuit block 191, and a scanning circuit block 171 disposed side by side in this order.

As described above, mixing scanning circuit blocks 171 and data circuit blocks 191 in disposing circuit blocks enables disposition of the scanning circuit blocks 171 and the data circuit blocks 191 side-by-side along the perimeter of the display region, achieving a slim bezel. In addition, this disposition eliminates overlap among these circuit blocks or crossing of the wires connecting the circuit blocks and the display part 101, achieving a simpler circuit arrangement.

The scanning circuit selects the scanning lines 103 one by one. Each scanning circuit block 171 is connected with one scanning line and supplies a first signal (so-called scanning signal) to the scanning line. In this example, one scanning line is connected with one pixel row 113 to select the pixel row 113.

The data circuit supplies a second signal (so-called data signal) to the pixels (sub-pixels) selected by the scanning circuit. As will be described later, each data circuit block 191 in this example is connected with three data lines 105 and selects the data lines 105 one by one to supply a signal. In this example, each of the three data lines is connected with a sub-pixel column in one pixel column 115.

Each data circuit block 191 selects a sub-pixel column from the connected pixel column 115 by selecting a data line 105 from the three connected data lines 105. Each data circuit block 191 supplies a data signal to the sub-pixel selected by the scanning circuit.

Figure 2A:
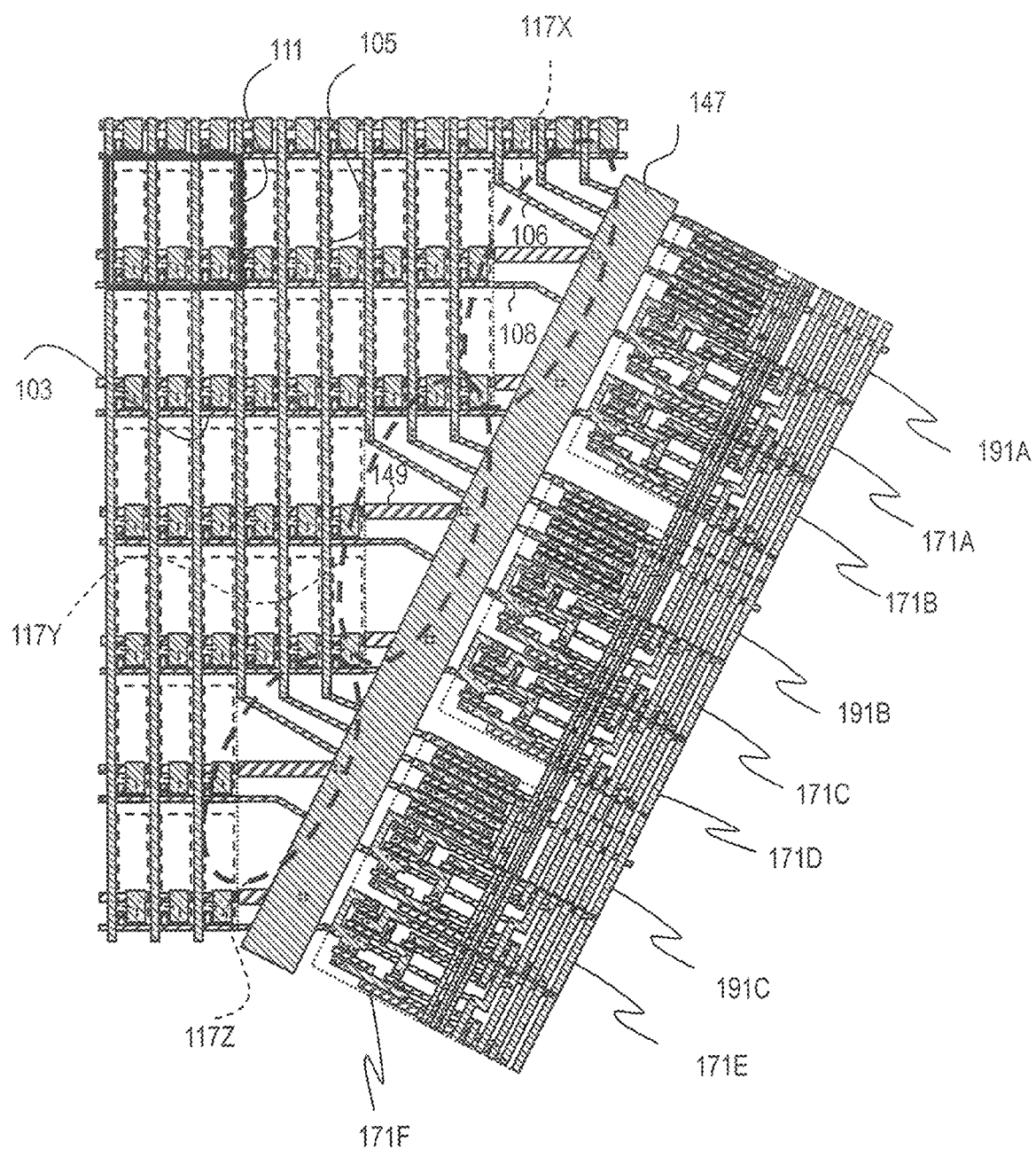
FIG. 2A illustrates details of a relation between a display part and a circuit part in which scanning circuit blocks and data circuit blocks are mixed.

FIG. 2A illustrates details of the relation between the display part 101 and the circuit part 125 in which scanning circuit blocks 171 and data circuit blocks 191 are mixed. FIG. 2A illustrates a configuration example in a liquid crystal display device. Sets of scanning circuit blocks and sets of data circuit blocks are disposed alternately along the perimeter of the display part 101. As illustrated in FIG. 2A, each pixel 111 is composed of three sub-pixels disposed side by side in the row direction. FIG. 2A illustrates a stair-like section of the perimeter of the display part 101 including three steps, specifically a step 117X, a step 117Y, and a step 117Z.

The steps 117X, 117Y, and 117Z are defined by the same number of rows and the same number of columns: one pixel column and two pixel rows. The steps 117X and 117Y adjacent to each other share one pixel and the steps 117Y and 117Z adjacent to each other share one pixel.

The data circuit block 191A and the scanning circuit blocks 171A and 171B are opposed to the step 117X. The data circuit block 191A is connected with data lines 105 through interconnection lines 106 and the scanning circuit blocks 171A and 171B are connected with scanning lines 103 through interconnection lines 108. The interconnection lines 106 and 108 may be on the same layers as the data lines and the scanning lines, respectively, or on different layers. For example, the interconnection lines 106 and 108 are on the same layer as the scanning lines that is different from the layer of the data lines. The same applies to the interconnection lines for other steps and circuit blocks. The interconnection line 108 is an example of a first signal line and the interconnection line 106 is an example of a second signal line.

The number of columns of the step 117X is equal to the number of data circuit blocks opposed to and connected with the step 117X. The number of rows of the step 117X is equal to the number of scanning circuit blocks opposed to and connected with the step 117X. The order of disposition of the data circuit block 191A and the scanning circuit blocks 171A and 171B corresponds to the order of disposition of pixel columns (data lines) and pixel rows (scanning lines) associated therewith (where to supply signals) in the step 117X.

The data circuit block 191B and the scanning circuit blocks 171C and 171D are opposed to the step 117Y. The data circuit block 191B is connected with data lines 105 through interconnection lines 106; the scanning circuit blocks 171C and 171D are connected with scanning lines 103 through interconnection lines 108. The number of columns of the step 117Y is equal to the number of data circuit blocks opposed to and connected with the step 117Y. The number of rows of the step 117Y is equal to the number of scanning circuit blocks opposed to and connected with the step 117Y. The order of disposition of the data circuit block 191B and scanning circuit blocks 171C and 171D corresponds to the order of pixel columns (data lines) and pixel rows (scanning lines) associated therewith (where to supply signals) in the step 117Y.

The data circuit block 191C and the scanning circuit blocks 171E and 171F are opposed to the step 117Z. The data circuit block 191C is connected with data lines 105 through interconnection lines 106; the scanning circuit blocks 171E and 171F are connected with scanning lines 103 through interconnection lines 108. The number of columns of the step 117Z is equal to the number of data circuit blocks opposed to and connected with the step 117Z.

The number of rows of the step 117Z is equal to the number of connected scanning circuit blocks opposed to and connected with the step 117Z. The order of disposition of the data circuit block 191C, scanning circuit blocks 171E and 171F corresponds to the order of pixel columns (data lines) and pixel rows (scanning lines) associated therewith (where to supply signals) in the step 117Z.

Between the display part 101 (pixels 111) and the circuit part of the scanning circuit blocks 171A to 171F and data circuit blocks 191A to 191C, a peripheral COM line (first power line) 147 is provided. The peripheral COM line 147 is connected with a plurality of internal COM lines 149 provided in the display part 101. The internal COM lines 149 in this example extend in the row direction. In an OLED display device, a power line is provided in place of the COM line. Disposing the peripheral COM line 147 closer to the display part 101 prevents voltage drop (IR DROP) that causes degradation in image quality.

At each step, the interconnection lines 106 and 108 are provided to be distant from one another without crossing one another. The interconnection lines 106 and 108 cross the peripheral COM line 147. Layout designing can be made easier by providing the interconnection lines 106 and 108 on a layer different from the layer of the peripheral COM line 147. For example, the peripheral COM line 147 can be provided on the same layer as data lines.

Figure 2B:
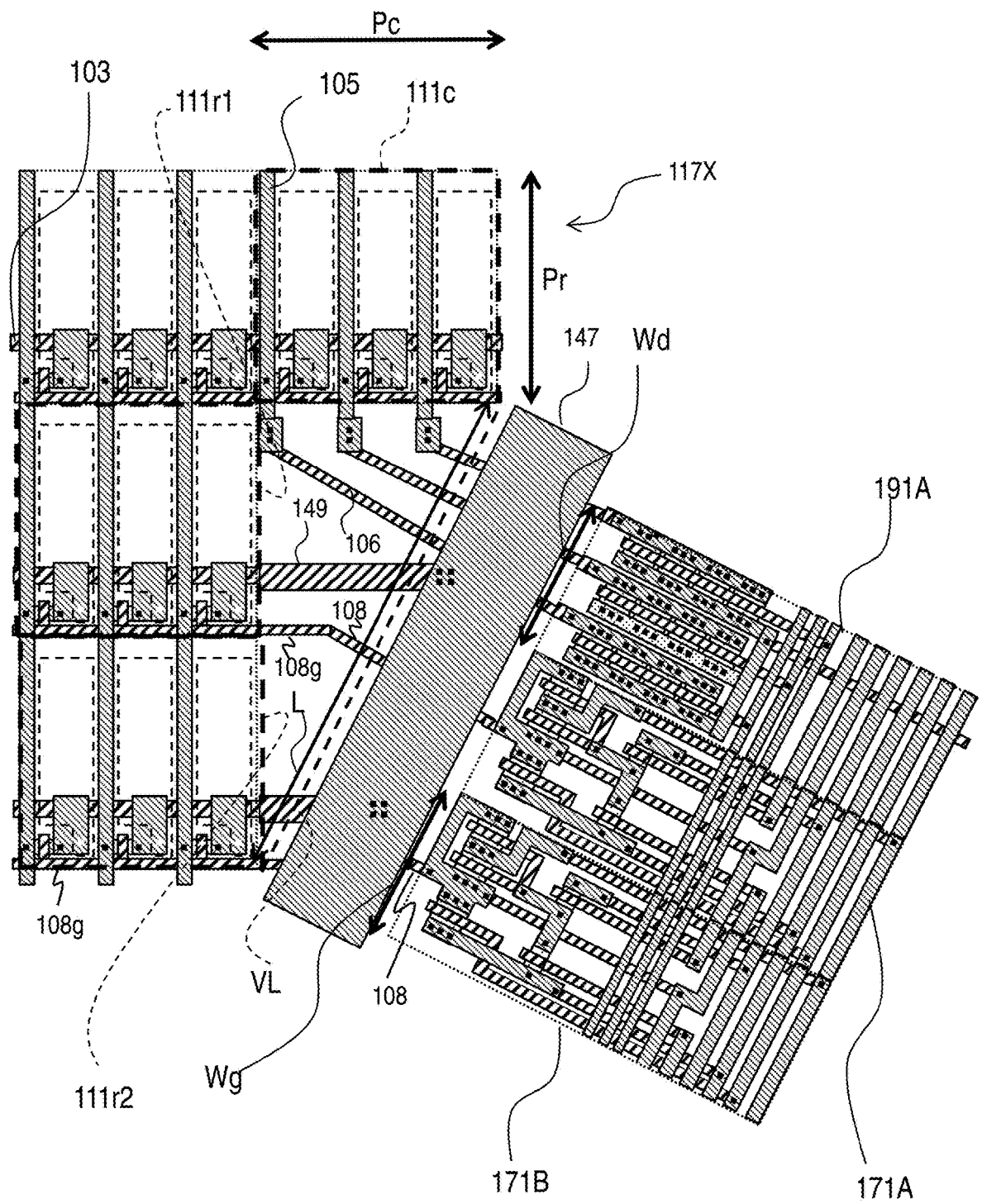
FIG. 2B illustrates a configuration of a step shown in FIG. 2A and the circuit blocks associated with the step.

FIG. 2B illustrates a configuration of the step 117X shown in FIG. 2A and the circuit blocks 191A, 171A and 171B associated with the step 117X. The following description is applicable to the other steps and the circuit blocks associated therewith.

The step 117X is defined by a pixel 111c belonging to a column, a pixel 111r1 belonging to a row, and a pixel 111r2 belonging to another row. The pitch of the pixel columns (pitch of the pixels in the row direction) is Pc. The pitch of the pixel rows (pitch of the pixels in the column direction) is Pr. In an example, Pc and Pr are equal. The pitch of the pixels in the row direction (or the column direction) means a cycle of disposition of pixels or a unit of repetition in disposing pixels.

The data circuit block 191A is connected with three data lines 105 for the column the pixel 111c belongs to through interconnection lines 106. The data circuit block 191A has terminals on the side facing the display part 101 (pixels 111) and is connected with the data lines 105 through the terminals. Each interconnection line 106 extends without crossing the other interconnection lines 106 and 108 or the other circuit blocks. Although the interconnection line 106 crosses the COM line 147, they are on different metal layers. It is not necessary to take account of their contact in designing the layout.

The scanning circuit blocks 171A and 171B are connected with a gate line (scanning line) 108g for the row the pixel 111r1 belongs to and a gate line 108g for the row the pixel 111r2 belongs to, respectively, through interconnection lines 108. The gate lines 108g and the interconnection lines 108 are provided on the same layer. Each interconnection line 108 extends without crossing the other interconnection lines 106 and 108 or the other circuit blocks. Although the interconnection line 108 crosses the COM line 147, they are on different metal layers. It is not necessary to take account of their contact in designing the layout.

As indicated in FIG. 2B, a virtual line (diagonal line) VL connecting two outer vertices of the step 117X is defined. The length of the virtual line VL is denoted by L. The step 117X and the virtual line VL define a recess (space) having a shape of a right triangle. In the example of FIG. 2B, the data circuit block 191A and the scanning circuit blocks 171A and 171B are disposed outer than the virtual line VL, or in an area away from the display part 101 (the associated step) more than the virtual line VL. This arrangement helps designing a layout including no wire crossing on the same layer. Depending on the design, a part or the whole of one or more circuit blocks may be disposed inner than the virtual line VL.

The length of the side of the data circuit block 191A facing the display part 101 (the step 117X) is denoted by Wd. In the following description, the length Wd is referred to as layout width or simply, width, of the data circuit block. In similar, the length of the side of the scanning circuit block 171A or 171B facing the display part 101 (the step 117X) is denoted by Wg. In the following, the length Wg is referred to as layout width or simply, width, of the scanning circuit block.

In the example of FIG. 2B, each of the data circuit block 191A and the scanning circuit blocks 171A and 171B has a quadrangular, particularly, rectangular shape. The term rectangle includes square. These circuit blocks may have another shape. For example, the shape of the circuit blocks can be a parallelogram different from a rectangle (whereas parallelogram includes rectangle), or a trapezoid. A trapezoidal circuit block is disposed in such a manner that the shorter one of the two parallel sides faces the display part 101.

The circuit unit for providing signals to the pixel rows and the pixel column of the step 117X consists of the data circuit block 191A and the scanning circuit blocks 171A and 171B. The shape of this circuit unit is defined by the smallest quadrangle including the circuit blocks 191A, 171A and 171B. The length of the side of the circuit unit facing the display part 101 (the step 117X) or the width of the circuit unit is expressed by the sum (Wd+2 Wg) of the width Wd of the data circuit block 191A and the sum of the widths Wg of the scanning circuit blocks 171A and 171B. In this example, there is no gap between circuit blocks within a circuit unit. Eliminating unnecessary gaps contributes for a slimmer bezel. Gaps may be provided.

In the example of FIG. 2B, the sides of the data circuit block 191A and the scanning circuit blocks 171A and 171B facing the display part 101 are parallel to the virtual line VL of the step 117X. In the following, the side of a circuit block facing the display part 101 (the step 117X) is referred to as opposite side. The opposite side does not need to be parallel to the virtual line VL.

The sum of the length of the opposite side of the data circuit block 191A projected to the virtual line VL and the lengths of the opposite sides of the scanning circuit blocks 171A and 171B projected to the virtual line VL is equal to or smaller than the length L of the virtual line VL.

In the example of FIG. 2B, the opposite sides of the circuit blocks 191A, 171A, and 171B are parallel to the virtual line VL. Accordingly, the total sum (Wd+2 Wg) of the width Wd of the data circuit block 191A and the sum of the widths Wg of the scanning circuit blocks 171A and 171B is equal to or smaller than the length L of the virtual line VL. Let the number of pixel columns belonging to the step be m and the number of pixel rows belonging to the step be n. If the opposite sides of the circuit blocks are parallel to the virtual line, $(n*Wg+m*Wd)$ is equal to or smaller than L. Using pixel pitches Pc and Pr, L can be expressed as $((m*Pc)^2+(n*Pr)^2)^{1/2}$.

Satisfying the foregoing condition in designing a layout of scanning circuit blocks and data circuit blocks facilitates determining a layout where the scanning circuit blocks and the data circuit blocks do not interfere (overlap) with those for the adjacent steps.

For example, the scanning circuit blocks and the data circuit blocks (or the circuit unit consisting of these) for a step are disposed in a range defined between the lines extending from the both ends of the virtual line VL perpendicularly to the virtual line VL. In another example, the scanning circuit blocks and the data circuit blocks (or the circuit unit consisting of these) for a step are disposed in a range defined between the lines extending from the center or the gravity center of the display part 101 through the both ends of the virtual line VL.

Figure 3:
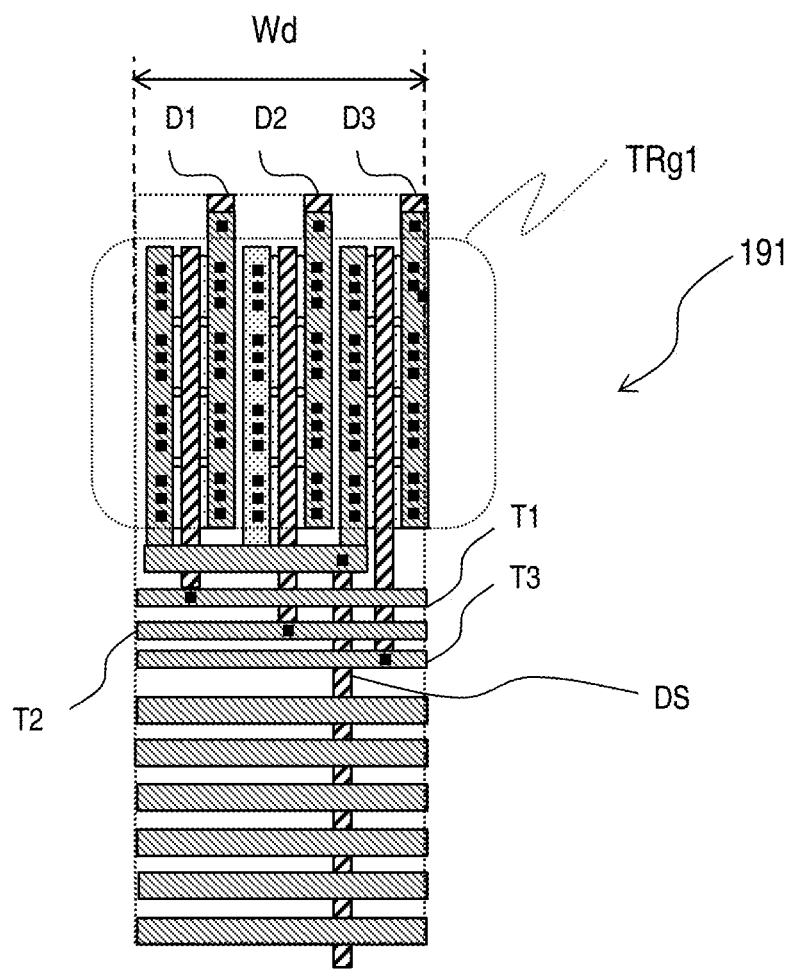
FIG. 3 illustrates a configuration example of a data circuit block.

FIG. 3 illustrates a configuration example of a data circuit block 191. The data circuit block 191 has a rectangular shape and has a width Wd. The data circuit block 191 is a DeMUX circuit including a plurality of TFTs and wires. The plurality of TFTs are collectively denoted by a reference sign TRg1. The plurality of TFTs include at least a second control transistor for controlling supply of a data signal. The data circuit block 191 is connected with one pixel column consisting of three sub-pixel columns. The data circuit block 191 selects the data lines for the three sub-pixel columns one by one in accordance with instructions from a controller (not shown).

The data circuit block 191 includes a T1 line, a T2 line, a T3 line, a D1 terminal, a D2 terminal, and a D3 terminal. Each of the D1 terminal, the D2 terminal, and the D3 terminal is connected with a data line for the associated sub-pixel column. The T1 line, the T2 line, and the T3 line are respectively connected with the D1 terminal, the D2 terminal, and the D3 terminal through a TFT. It is preferable that the directions in which the T1 line, the T2 line, and the T3 line extend are parallel to the virtual line VL in FIG. 2B. Providing the T1 line, T2 line, and T3 line in parallel to the virtual line VL enables the area occupied by the lines to be smaller, achieving a slimmer bezel. The T1 line, T2 line, and T3 line are examples of the wires for supplying a signal for controlling the data circuit block 191 (such as a control signal indicating ON or OFF).

When the signal for the T1 line is ON, the data circuit block 191 outputs the data signal provided through a DS line from the D1 terminal to the data line. When the signal for the T2 line is ON, the data circuit block 191 outputs the data signal provided through the DS line from the D2 terminal to the data line. When the signal for the T3 line is ON, the data circuit block 191 outputs the data signal provided through the DS line from the D3 terminal to the data line.

Figure 4:
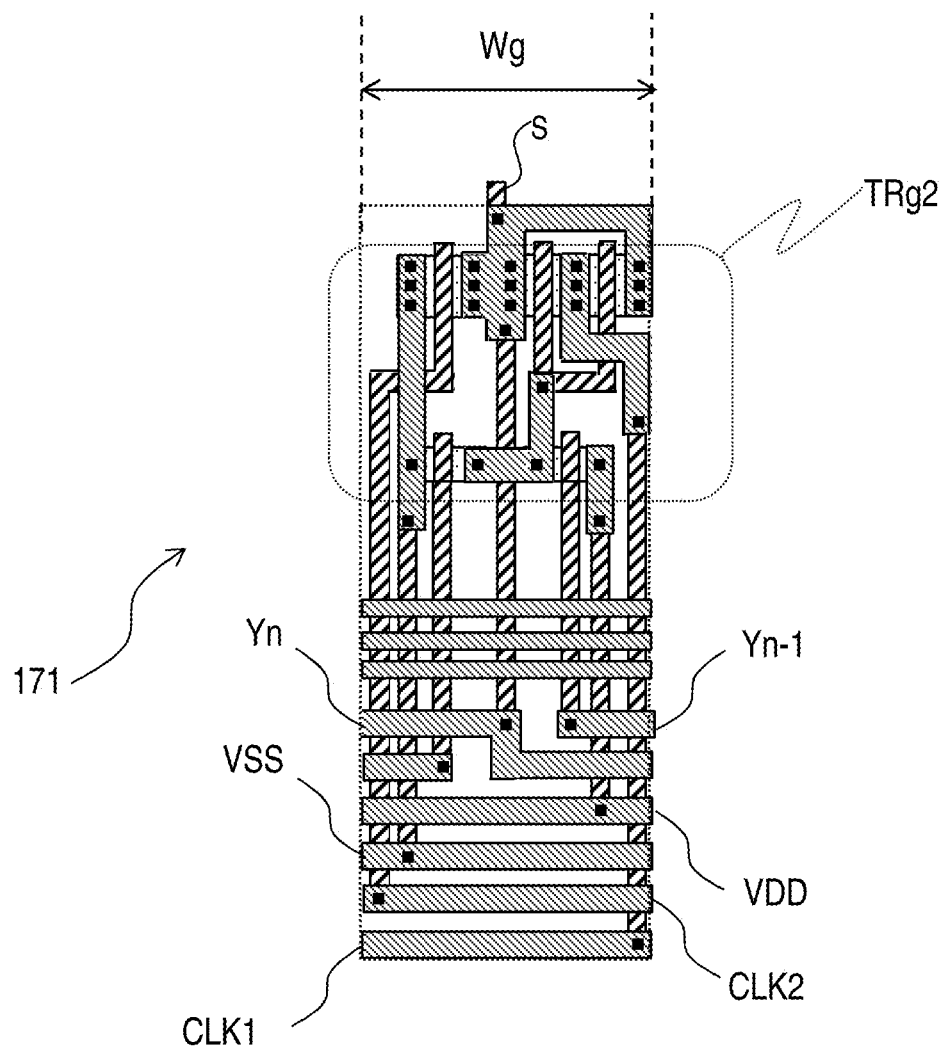
FIG. 4 illustrates a configuration example of scanning circuit block.

FIG. 4 illustrates a configuration example of a scanning circuit block 171. The scanning circuit block 171 is a shift register circuit including a plurality of TFTs and wires. The plurality of TFTs are collectively denoted by a reference sign TRg2. The plurality of TFTs includes at least a first control transistor for controlling supply of a scanning signal. The scanning circuit block 171 has a rectangular shape and has a width Wg. A terminal S is connected with the associated scanning line.

A VDD line and a VSS line are power lines to apply different potentials to the scanning circuit block 171. A CLK1 line and a CLK2 line are wires to provide control signals for controlling the scanning circuit block, such as clock signals. The VDD line, the VSS line, the CLK1 line, and the CLK2 line are common to the scanning circuit blocks 171.

It is preferable that the directions in which VDD line, the VSS line, the CLK1 line, and the CLK2 line extend is parallel to the virtual line VL in FIG. 2B. Providing the VDD line, the VSS line, the CLK1 line, and the CLK2 line in parallel to the virtual line VL enables the area occupied by these lines to be smaller, achieving a slimmer bezel.

A Yn line is connected with the terminal S to provide an output for the scanning line of the scanning circuit block 171. The Yn line is connected with the adjacent scanning circuit blocks 171 on both sides. A Yn+1 line is to provide an output for the next scanning circuit block and is connected with the next scanning circuit. The clock signal on the CLK1 line has a complementary relation with the clock signal on the CLK2 line. The scanning circuit block 171 successively outputs selection signals to the scanning line synchronously with changes in the CLK1 signal and the CLK2 signal.

In the foregoing example, the scanning circuit blocks are row circuit blocks for providing a signal to the pixel rows and the data circuit blocks are column circuit blocks for providing a signal to the pixel columns. Unlike this configuration, the scanning circuit blocks can be column circuit blocks and the data circuit blocks can be row circuit blocks. The scanning circuit blocks, the data circuit blocks, the row circuit blocks, and the column circuit blocks are circuit blocks.

In the foregoing example, the data circuit blocks in each circuit unit opposed to a step have the identical shapes and circuit configurations. The same applies to the scanning circuit blocks in each circuit unit opposed to a step. In the configuration example illustrated in FIG. 2A, the heights of a data circuit block and a scanning circuit block adjacent to each other are the same. Such a configuration achieves an even bezel and uniform or well-balanced circuit characteristics. In the configuration example illustrated in FIG. 2A, the heights of all data circuit blocks and scanning circuit blocks for every step are the same.

In an example, all circuit blocks opposed to a step have the same height as described above. Among different steps, the height of the circuit blocks for a step may be different from the height of the circuit blocks for another step. Such a configuration enables the bezel width to be varied depending on the step in the display region. The configuration in which all circuit blocks have the same height achieves an even bezel and uniform or well-balanced circuit characteristics.

Designing Display Device

Hereinafter, a method of designing the layout of a peripheral circuit including a data circuit and a scanning circuit is described. As described above, the mixed circuit part 125 includes a scanning circuit block and a data circuit block disposed to be adjacent to each other. For a slimmer bezel, it is effective that the scanning circuit blocks and the data circuit blocks opposed to the same step have the same layout height (also simply referred to as height). The height of a circuit block is the length in the direction perpendicular to the width. For example, when the opposite side of a circuit block is parallel to the virtual line VL as illustrated in FIG. 2B, the height of the circuit block is the length in the direction perpendicular to the virtual line VL.

The sizes of the scanning circuit blocks and the data circuit blocks are different depending on the number of transistors included in the circuit block or the channel sizes of the transistors. The data circuit blocks include large-size transistors because the data circuit blocks of DeMUX circuits require low ON resistance. The scanning circuit blocks include large number of transistors because the scanning circuit blocks of shift register circuits are complicated logic circuits.

The ratio α of the width Wg of a scanning circuit block to the width Wd of a data circuit block is expressed as Wg/Wd. In the following description, the heights of the scanning circuit blocks and the data circuit blocks are the same. In designing a scanning circuit block and a data circuit block, a can be given as a constant. When the scanning circuit block is larger than the data circuit block in size, α is greater than 1. Contrarily, when the data circuit block is larger than the scanning circuit block in size, a is smaller than 1.

In both of the scanning circuit block and the data circuit block, the layout height is inversely proportional to the layout width, if the circuit configuration is unchanged. If the layout width is increased, the layout height can be decreased, in other words, the bezel width can be decreased.

Designing the layout of the peripheral circuit determines the layout widths Wd and Wg of the data circuit blocks and the scanning circuit blocks in a circuit unit associated with (opposed to) a step of the display part 101 as follows.

Let m to be the number of pixel columns of the step, n to be the number of pixel rows of the step, Pr to be the pitch of the pixel rows, and Pc to be the pitch of the pixel columns. As described above, the length L of the virtual line (diagonal line) VL of the step can be expressed as follows:

$$L=((mPc)^2+(nPr)^2)^{1/2} \quad (1)$$

Furthermore, if the pixel pitches in the row direction and the column direction are equal, the length L of the virtual line (diagonal line) VL of the step can be expressed with the pixel pitch P as follows:

$$L=P(m^2+n^2)^{1/2} \quad (2)$$

The number of data circuit blocks that are opposed to the step and provide a signal to the pixel columns (data lines) of the step is m and the number of scanning circuit blocks that are opposed to the step and provide a signal to the pixel rows (scanning lines) of the step is n. In the following description, the m data circuit blocks have the same configuration and the n scanning circuit blocks have the same configuration. Accordingly, the total sum W of the widths of the data circuit blocks and scanning circuit blocks opposed to the step can be expressed as follows:

$$W=mWd+nWg \quad (3)$$

When the total sum W of the widths of the circuit blocks is equal to or less than the length L of the diagonal line of the step, the circuit blocks can be easily laid out in such a manner that the circuit blocks for adjacent steps do not interfere (overlap) with each other. Furthermore, when the total sum W of the widths of the circuit blocks is equal to the length L of the diagonal line of the step, the width Wd of each data circuit block (referred to as data circuit block width Wd) and the width Wg of each scanning circuit block (referred to as scanning circuit block width Wg) are the maximum to achieve the slimmest possible bezel.

This is because, as described above, if the data circuit blocks and the scanning circuit blocks have the same height, the ratio α of the data circuit block width Wd to the scanning circuit block width Wg is substantially fixed and therefore, the height of the circuit blocks is shorter when the circuit block widths Wd and Wg are larger. The sides of the circuit blocks facing the display part 101 are parallel to the virtual line VL. If these sides are not parallel, in other words, if the sides of the circuit blocks facing the display part 101 are inclined with respect to the virtual line VL, the numerical value obtained by projecting the widths of the circuit blocks onto the virtual line VL can be used in place of the total sum of the widths of the circuit blocks. Now, the following variables are defined:

$$\beta=n/m \quad (4)$$

$$\alpha=Wg/Wd \quad (5)$$

If the total sum W of the widths of the circuit blocks is equal to the length L of the virtual line VL, the data circuit block width Wd and the scanning circuit block width Wg can be expressed with α and β as follows:

$$Wd=(Pc^2+(\beta Pr)^2)^{1/2}/(1+\alpha\beta) \quad (6)$$

$$Wg=\alpha(Pc^2+(\beta Pr)^2)^{1/2}/(1+\alpha\beta) \quad (7)$$

Furthermore, if the pixel pitches in the row direction and the column direction are the same, the data circuit block width Wd and the scanning circuit block width Wg can be expressed with the pitch P as follows:

$$Wd=P(1+\beta^2)^{1/2}/(1+\alpha\beta) \quad (8)$$

$$Wg=\alpha P(1+\beta^2)^{1/2}/(1+\alpha\beta) \quad (9)$$

As described above, if the data circuit blocks and the scanning circuit blocks have the same height, α can be given as a constant in the layout designing. The value of β is a value specific to the step. Accordingly, the layout designing can determine the maximum data circuit block widths Wd and scanning circuit block widths Wg for individual steps, using the foregoing formulae.

The foregoing determination of the circuit block widths for individual steps enables achievement of the slimmest bezel areas for individual steps. The layout designing may employ a data circuit block width Wd and a scanning circuit block width Wg smaller than the maximum values given by the above formulae, depending on the given request (condition).

For a circuit part 125 in which data circuit blocks and scanning circuit blocks are mixed, the layout designing may determine the data circuit block widths Wd and the scanning circuit block widths Wg separately for individual steps of the display part 101 as described above. Alternatively, the layout designing may determine the data circuit block width Wd and the scanning circuit block width Wg common to the steps. As a result, an even bezel area and uniform or well-balanced circuit characteristics are achieved.

The layout sizes of the circuit blocks with which circuit blocks of adjacent steps do not interfere with each other are easily determined by applying the smallest values for the data circuit block width Wd and the scanning circuit block width Wg among the steps to all steps.

The data circuit block width Wd and the scanning circuit block width Wg are given by the foregoing formulae (6) and (7), respectively. The data circuit block width Wd and the scanning circuit block width Wg takes the smallest values at a step satisfying the following condition:

$$\beta=n/m=\alpha/k \quad (10)$$

$$k=(Pr/Pc)^2 \quad (11)$$

Under the condition of the formula (10), the total width W of the circuit blocks for a given step each having a data circuit block width Wd or a scanning circuit block width Wg expressed by the formulae (6) or (7) is equal to or less than the length L of the virtual line. The layout designing employs values equal to or less than these values for the data circuit block width Wd and the scanning circuit block width Wg as common values and applies these values to all steps.

At the step where β takes the value expressed by the formula (10) or a value closest thereto, the data circuit block width Wd and the scanning circuit block width Wg take the smallest values. If the pixel pitch in the row direction is equal to the pixel pitch in the column direction, the foregoing condition can be expressed as follows:

$$\beta = \alpha \quad (12)$$

When the formula (12) is satisfied, the data circuit block width Wd and the scanning circuit block width Wg are expressed as follows:

$$Wd = P/(1+\alpha^2)^{1/2} \quad (13)$$

$$Wg = \alpha P/(1+\alpha^2)^{1/2} \quad (14)$$

Figure 5:
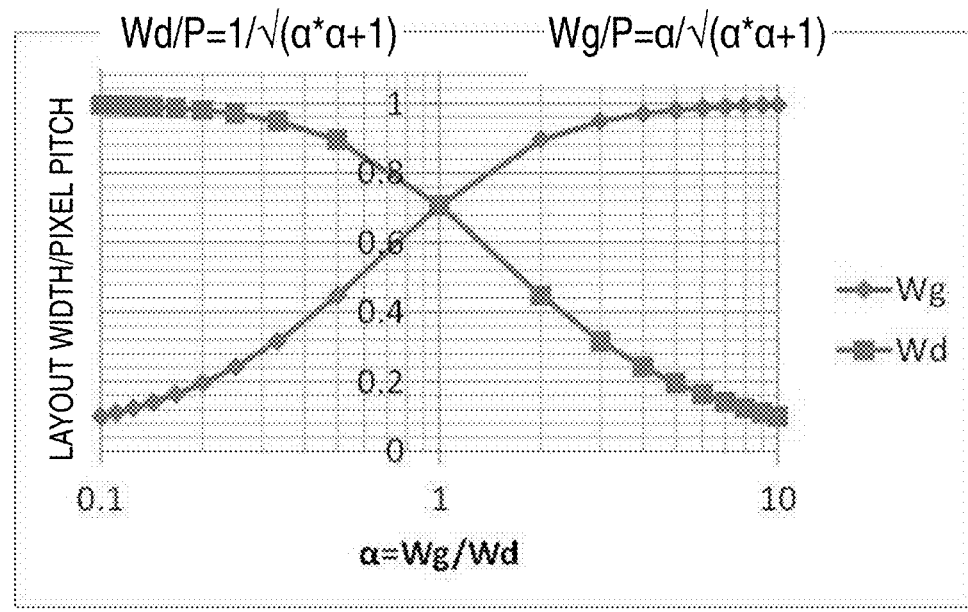
FIG. 5 illustrates relations between data circuit block width Wd and α and between scanning circuit block width Wg and a under the condition of $\beta=\alpha$.

FIG. 5 illustrates relations between the data circuit block width Wd and α and between the scanning circuit block width Wg and α under the condition where the formula (12) is satisfied. The data circuit block width Wd becomes smaller and the scanning circuit block width Wg becomes larger as α increases.

Figure 6:
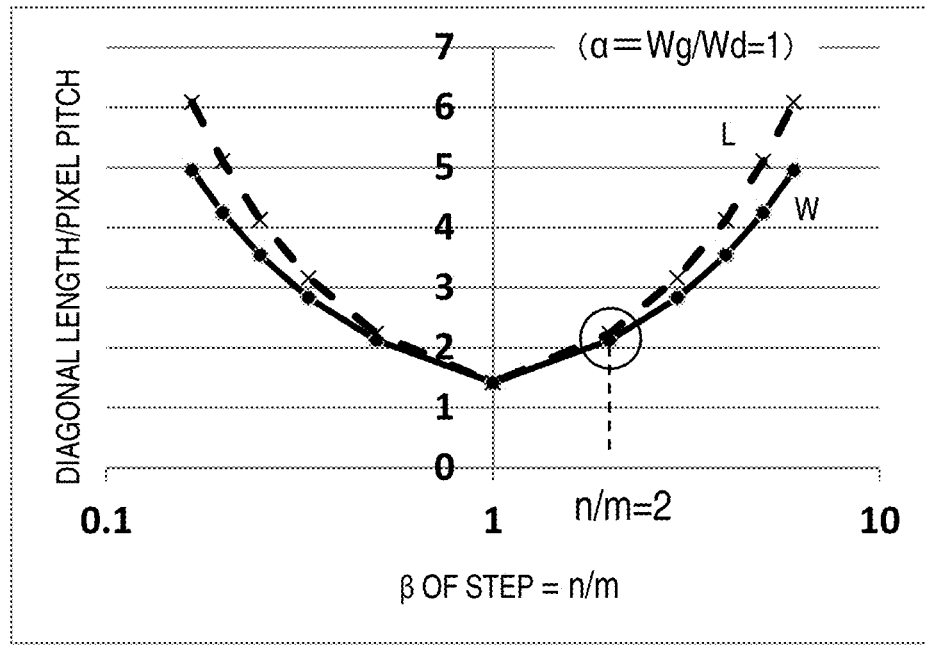
FIG. 6 illustrates examples of relations between the length L of a virtual line and β and between the total sum W of the widths of circuit blocks and β under the condition of α $(=Wg/Wd)=1$.

FIG. 6 illustrates examples of relations between the length L of the virtual line VL and β and between the total sum W of the widths of circuit blocks and β under the condition of α (=Wg/Wd)=1. The dashed line represents the length L of the virtual line VL of a step and the solid line represents the total sum W of the widths of the data circuit blocks and scanning circuit blocks for the step.

As illustrated in FIG. 6 and based on the formula (12), when β (=n/m) is 1, the length L of the virtual line VL is equal to the total sum W of the widths of the circuit blocks. As noted from FIG. 6, when β takes a value other than 1, the total sum W of the widths of the circuit blocks is smaller than the length L of the virtual line VL. Accordingly, a data circuit block and a scanning line block having widths allowed for the diagonal range of a step where β is 1 can be placed at any other steps. The data circuit block width Wd and the scanning circuit block width Wg produce a surplus to the diagonal range L of a step where β is other than 1.

Figure 7:
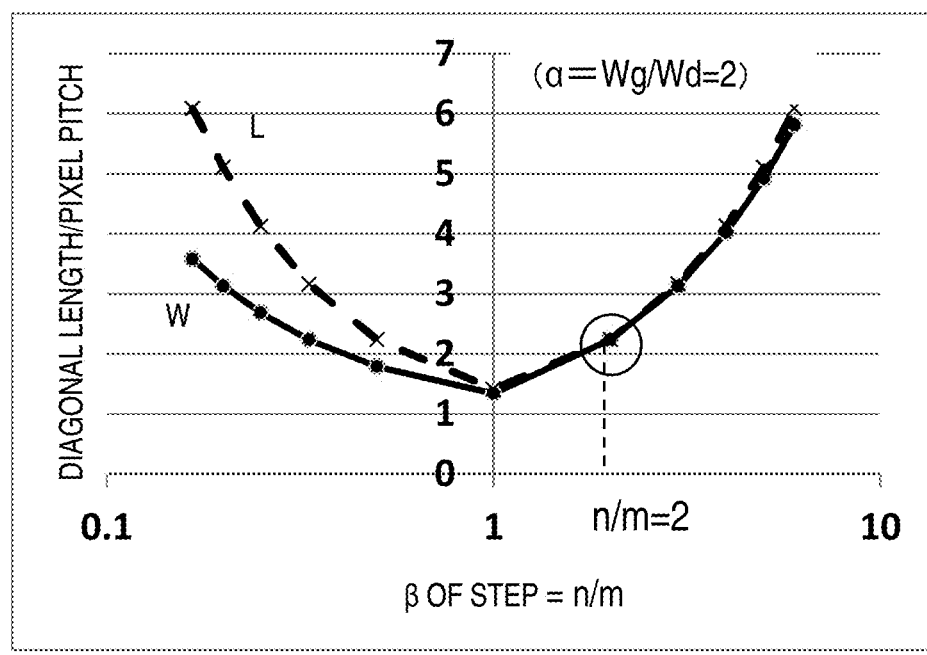
FIG. 7 illustrates examples of relations between the length L of the virtual line and R and between the total sum W of the widths of circuit blocks and β under the condition of α $(=Wg/Wd)=2$.

FIG. 7 illustrates examples of relations between the length L of the virtual line VL and β and between the total sum W of the widths of circuit blocks and β under the condition of α (=Wg/Wd)=2. The dashed line represents the length L of the virtual line VL of a step and the solid line represents the total sum W of the widths of the data circuit blocks and scanning circuit blocks for the step.

As illustrated in FIG. 7 and based on the formula (12), when β (=n/m) is 2, the length L of the virtual line VL is equal to the total sum W of the widths of the circuit blocks. As noted from FIG. 7, when β takes a value other than 2, the total sum W of the widths of the circuit blocks is smaller than the length L of the virtual line VL. Accordingly, a data circuit block and a scanning circuit block having widths allowed for the diagonal range of a step where β is 2 can be placed at any other steps. The data circuit block width Wd and the scanning circuit block width Wg produce a surplus to the diagonal range L of a step where β is other than 2, particularly, of a step where β is smaller than 1.

Figure 8:
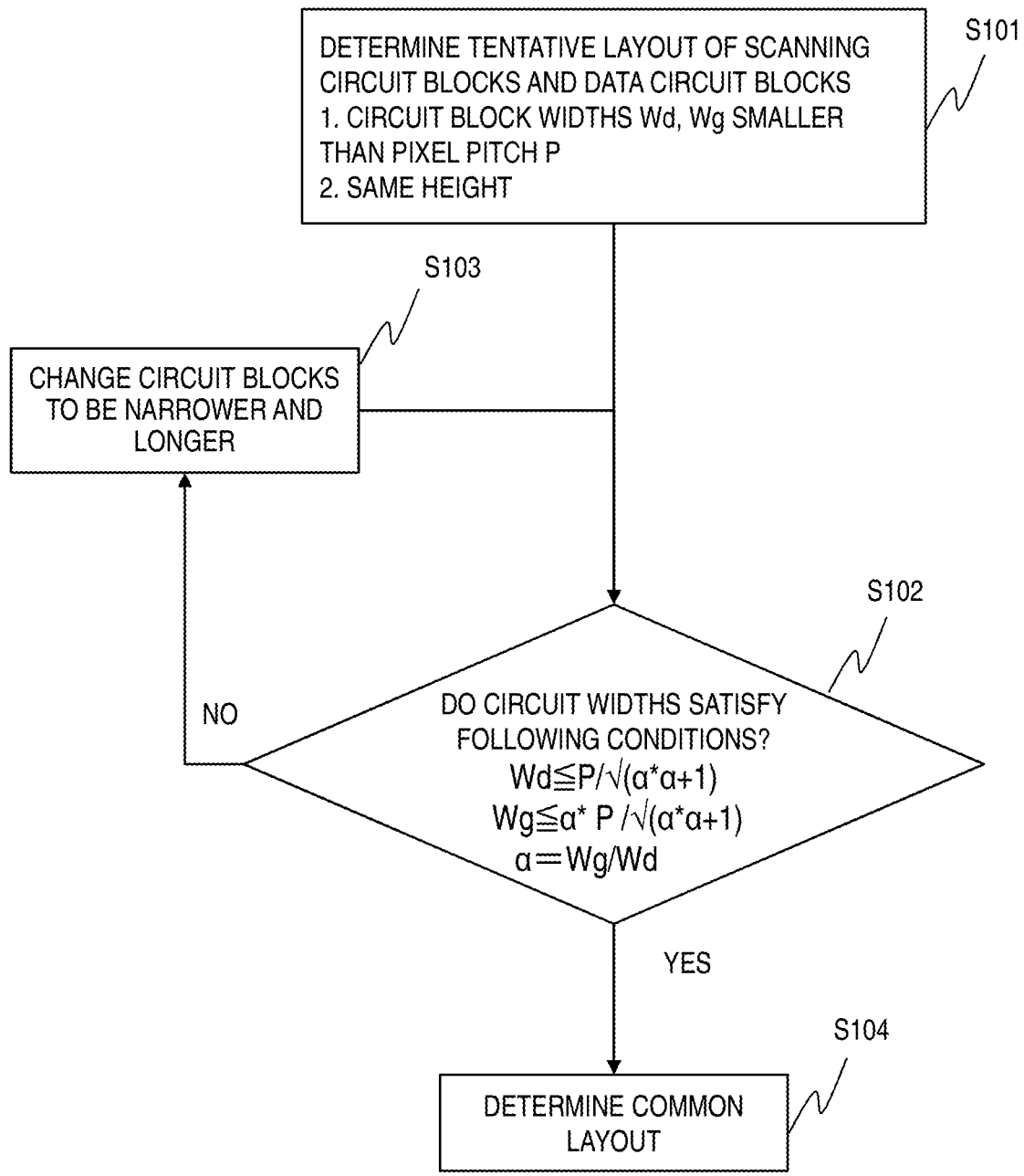
FIG. 8 is an example of a flowchart to determine a layout (a data circuit block width Wd and a scanning circuit block width Wg) common to the steps.

Hereinafter, an example of a flow to determine the data circuit block width Wd and the scanning circuit block width Wg for each step in the layout designing is described. FIG. 8 is an example of the flowchart to determine a layout (the data circuit block width Wd and the scanning circuit block width Wg) common to the steps. The pixel pitches in the row direction and the column direction are the same P. For example, the designer or the system can determine a common layout in accordance with this flow.

The layout designing first determines tentative values for the data circuit block width Wd and the scanning circuit block width Wg (S101). The tentative values are determined to be less than the pixel pitch P. The heights of the data circuit blocks and the scanning circuit blocks are determined to be the same value.

Next, the layout designing compares the tentative values of the data circuit block width Wd and the scanning circuit block width Wg with the value of $P/(\alpha^2+1)^{1/2}$ and the value of $\alpha P/(\alpha^2+1)^{1/2}$, respectively (S102). As expressed in the formulae (13) and (14), these values are the smallest values for the data circuit block widths Wd and the scanning circuit block widths Wg for the steps of the display part 101. If the tentative data circuit block width Wd and scanning circuit block width Wg are equal to or smaller than these values, the tentative values can be used for any steps.

If the tentative data circuit block width Wd is larger than $P/(\alpha^2+1)^{1/2}$ or if the tentative scanning circuit block width Wg is larger than $\alpha P/(\alpha^2+1)^{1/2}$ (S102: NO), the layout designing changes the sizes of the data circuit blocks and the scanning circuit blocks (S103). Specifically, the layout designing decreases the data circuit block width Wd and the scanning circuit block width Wg and increases the height of the data circuit blocks and the scanning circuit blocks. Thereafter, the layout designing returns to Step S102.

If the tentative data circuit block width Wd is equal to or less than $P/(\alpha^2+1)^{1/2}$ and the tentative scanning circuit block width Wg is equal to or less than $a\beta/(\alpha^2+1)^{1/2}$ (S102: YES), the layout designing determines that those circuit block widths are the widths in the common layout (S104). In the case of applying the common layout to all steps, the layout sizes determined at Step S104 are applied to all data circuit blocks and the scanning circuit blocks.

Figure 9:
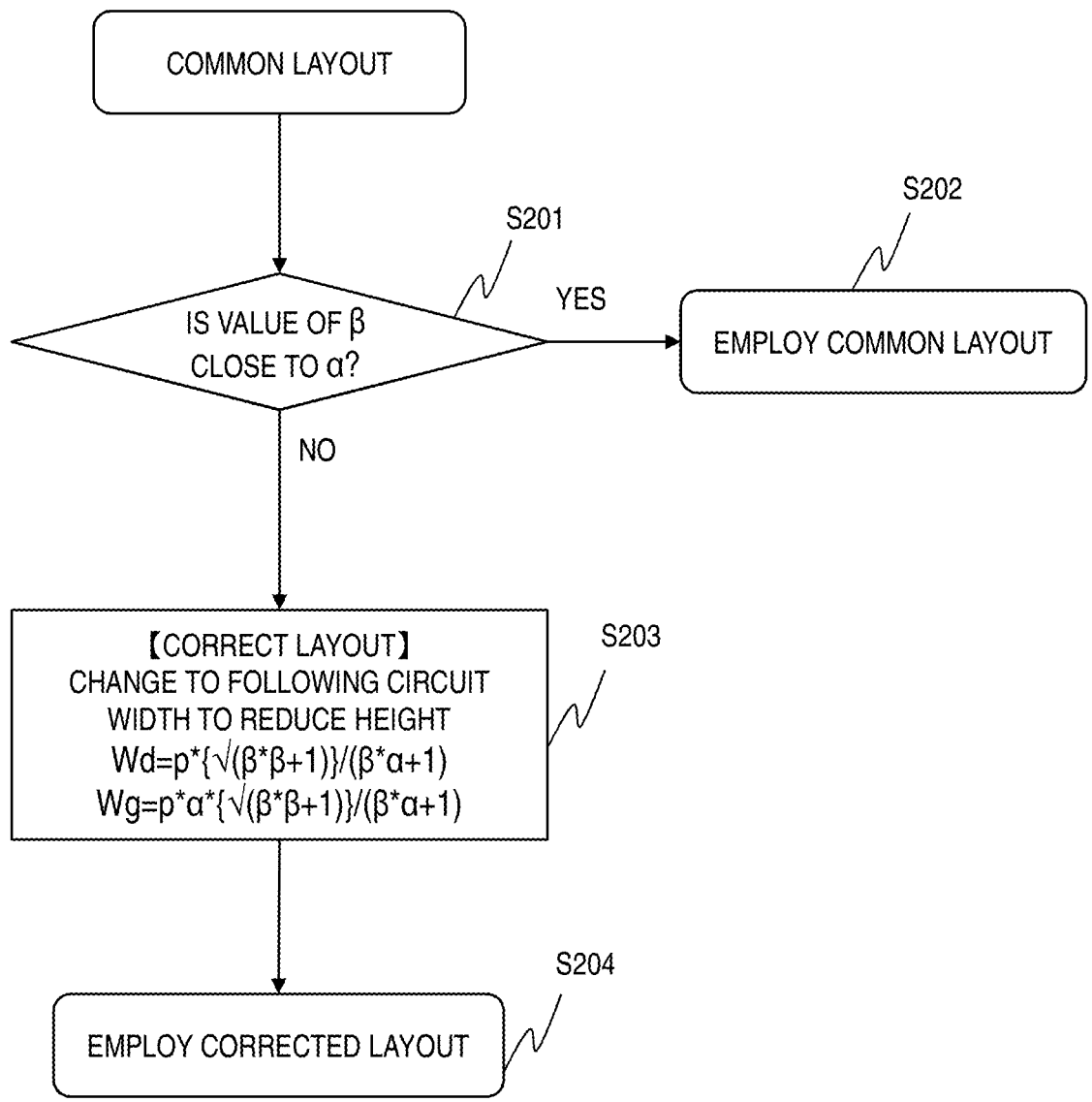
FIG. 9 is a flowchart to determine the data circuit block width Wd and the scanning circuit block width Wg for one step.

Next, a flow to determine the data circuit block width Wd and the scanning circuit block width Wg differently for each step is described. FIG. 9 is a flowchart to determine the data circuit block width Wd and the scanning circuit block width Wg for one step.

The layout designing compares α of the common layout with β for the selected step (S201). Specifically, the layout designing acquires the data circuit block width Wd and the scanning circuit block width Wg in the common layout determined in accordance with the flowchart of FIG. 8 and calculates the value of α=Wg/Wd. The layout designing further calculates the value of β=n/m of the step. If the difference between α and β is smaller than a predetermined value, the layout designing determines that β is close to α.

If β of the step is close to α of the common layout (S201: YES), the layout designing determines the data circuit block width Wd and the scanning circuit block width Wg of the common layout to be those for the step (S202). If the difference between β of the step and α of the common layout is large (S201: NO), the layout designing determines more appropriate data circuit block width Wd and scanning circuit block width Wg for the step (S203).

Specifically, the layout designing determines the data circuit block width Wd and the scanning circuit block width Wg in accordance with the formulae (8) and (9), respectively. The formulae (8) and (9) respectively provide the maximum data circuit block width Wd and the maximum scanning circuit block width Wg for the step. Lastly, the layout designing determines the values obtained by the formulae (8) and (9) to be the data circuit block width Wd and the scanning circuit block width Wg for the step (S204).

The foregoing example achieves a smaller number of steps to newly determine the data circuit block width Wd and the scanning circuit block width Wg by referencing the common layout. Unlike this example, the layout designing may determine the data circuit block width Wd and the scanning circuit block width Wg for every step using the formulae (8) and (9) without referencing the common layout. The values for the data circuit block width Wd and the scanning circuit block width Wg for each step are selected from the values equal to or less than the values obtained by the formulae (8) and (9).

Figure 10A:
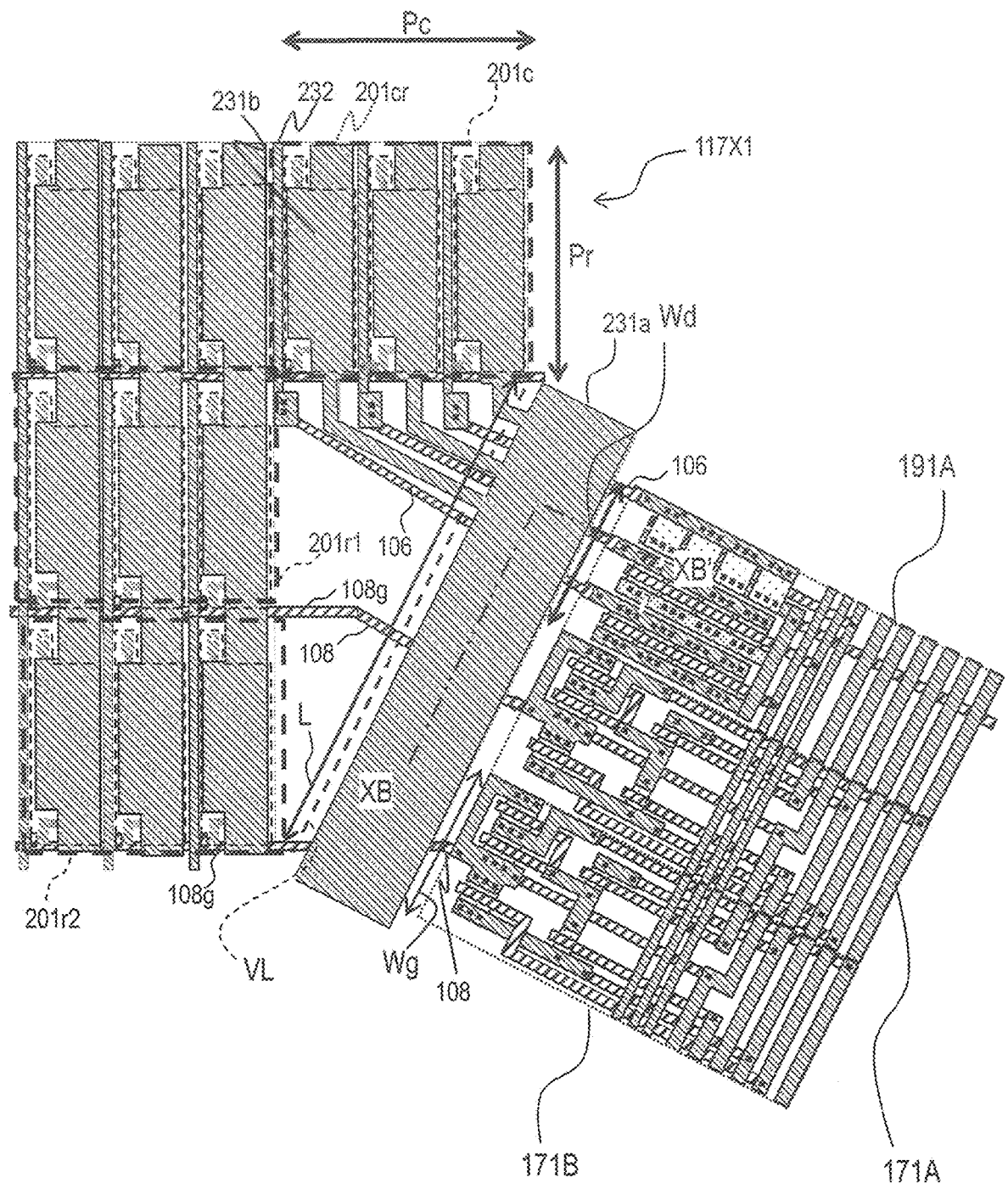
FIG. 10A illustrates a configuration example of a step and circuit blocks associated with the step.

Hereinafter, OLED pixels are described as another example of pixels. FIG. 10A illustrates structures of a step 117X1 corresponding to the step 117X in FIG. 2A and circuit blocks 191A, 171A and 171B associated therewith. Although FIGS. 2A and 2B illustrate pixels including liquid crystal as an example of pixels, FIG. 10A illustrates pixels including OLEDs. The following description is applicable to the other steps and the circuit blocks associated therewith.

The step 117X1 is defined by a pixel 201$c$ belonging to a column, a pixel 201$r$1 belonging to a row, and a pixel 201$r$2 belonging to another row. The pitch of the pixel columns (pitch of the pixels in the row direction) is Pc. The pitch of the pixel rows (pitch of the pixels in the column direction) is Pr.

The data circuit block 191A is connected with three data lines 232 for the pixel column the pixel 201$c$ belongs to through interconnection lines 106. The data circuit block 191A has terminals on the side facing the display part 101 (the pixels such as the pixel 201$c$) and is connected with the data lines 232 through the terminals. Each interconnection line 106 extends without crossing the other interconnection lines 106 and 108 or the other circuit blocks. Although the interconnection line 106 crosses a main power line (first power line) 231$a$, they are on different metal layers. It is not necessary to take account of their contact in designing the layout.

The scanning circuit blocks 171A and 171B are connected with a gate line 108$g$ for the row the pixel 201$r$1 belongs to and a gate line 108$g$ for the row the pixel 201$r$2 belongs to, respectively, through interconnection lines 108. The gate lines 108$g$ and the interconnection lines 108 are provided on the same layer. Each interconnection line 108 extends without crossing the other interconnection lines 106 and 108 or the other circuit blocks. Although the interconnection line 108 crosses the main power line 231$a$, they are on different metal layers. It is not necessary to take account of their contact in designing the layout.

Each sub-pixel has an OLED power line 231$b$ extending in the column direction. The OLED power line 231$b$ is a second power line branching off from the main power line 231$a$. The main power line 231$a$ supplies electric current required for the OLEDs to light to the sub-pixels disposed in a column through an OLED power line 231$b$.

The sub-pixel 201$cr$ is a sub-pixel included in the pixel 201$c$. As illustrated in FIG. 10A, the main power line 231$a$ is provided between the display part 101 (display region) and the circuit blocks 191A, 171A, and 171B. Disposing the main power line 231$a$ closer to the display region prevents voltage drop (IR DROP) to stabilize the luminosity of the emitted light and prevent degradation in image quality.

Figure 10B:
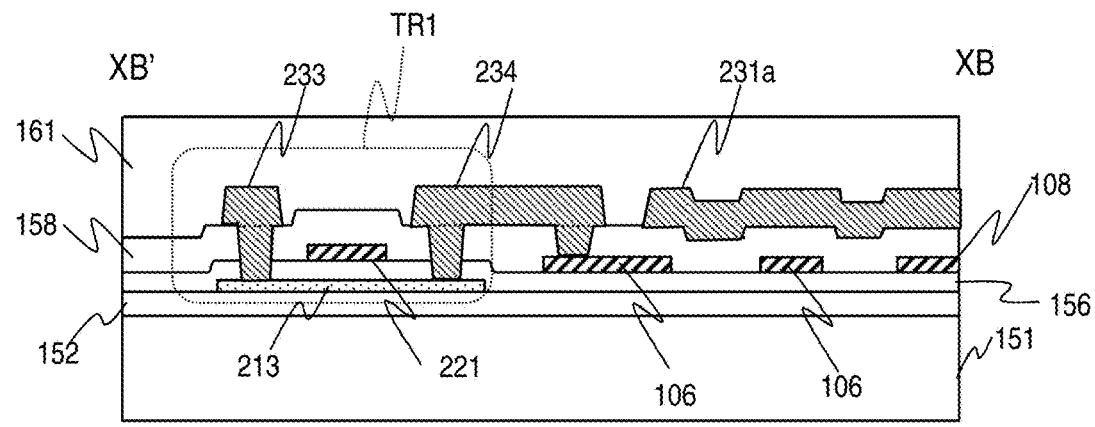
FIG. 10B is a cross-sectional diagram cut along the line XB-XB' in FIG. 10A.

FIG. 10B is a cross-sectional diagram cut along the line XB-XB' in FIG. 10A. A TFT TR1, the main power line 231$a$, the interconnection lines 106 for the data circuit block 191A, and the interconnection line 108 for the scanning circuit block 171A are provided on an insulating substrate 151. The TFT TR1 is one of a plurality of TFTs TRg1 of the data circuit block 191A and is an example of a second control transistor.

More specifically, an insulating film 152 is provided on the insulating substrate 151. The channel (semiconductor layer) 213 of the TFT TR1 is provided on the insulating film 152. A gate insulating film 156 is provided to cover the channel 213 and the insulating film 152. A gate electrode 221 and the interconnection lines 106 and 108 are provided on the gate insulating film 156. These are a part of the same first metal layer (the second layer) and can be formed together.

An interlayer insulating film 158 is provided to cover the gate electrode 221, the interconnection lines 106 and 108, and the gate insulating film 156. Contact holes are provided to pass through the interlayer insulating film 158 and the gate insulating film 156. Source/drain electrodes 233 and 234 of the TFT TR1 and the main power line 231$a$ are provided on the interlayer insulating film 158. These are a part of the same second metal layer and can be formed together.

The source/drain electrodes 233 and 234 are connected with the channel 213 through contact holes. The source/drain electrodes 233 and 234 are also connected with an interconnection line 106 through another contact hole. The source/drain electrodes 233 and 234, the main power line 231$a$ and the interlayer insulating film 158 are covered by an uppermost planarization film 161.

Configuration of Pixel Circuit

Figure 11:
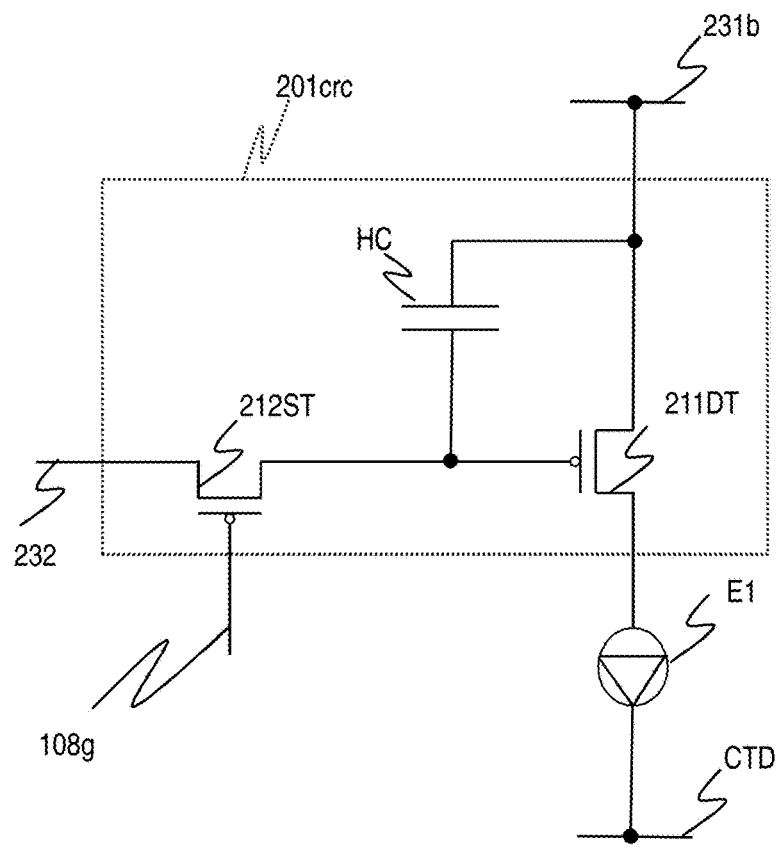
FIG. 11 illustrates an equivalent circuit to a pixel circuit and an OLED element.
Figure 12A:
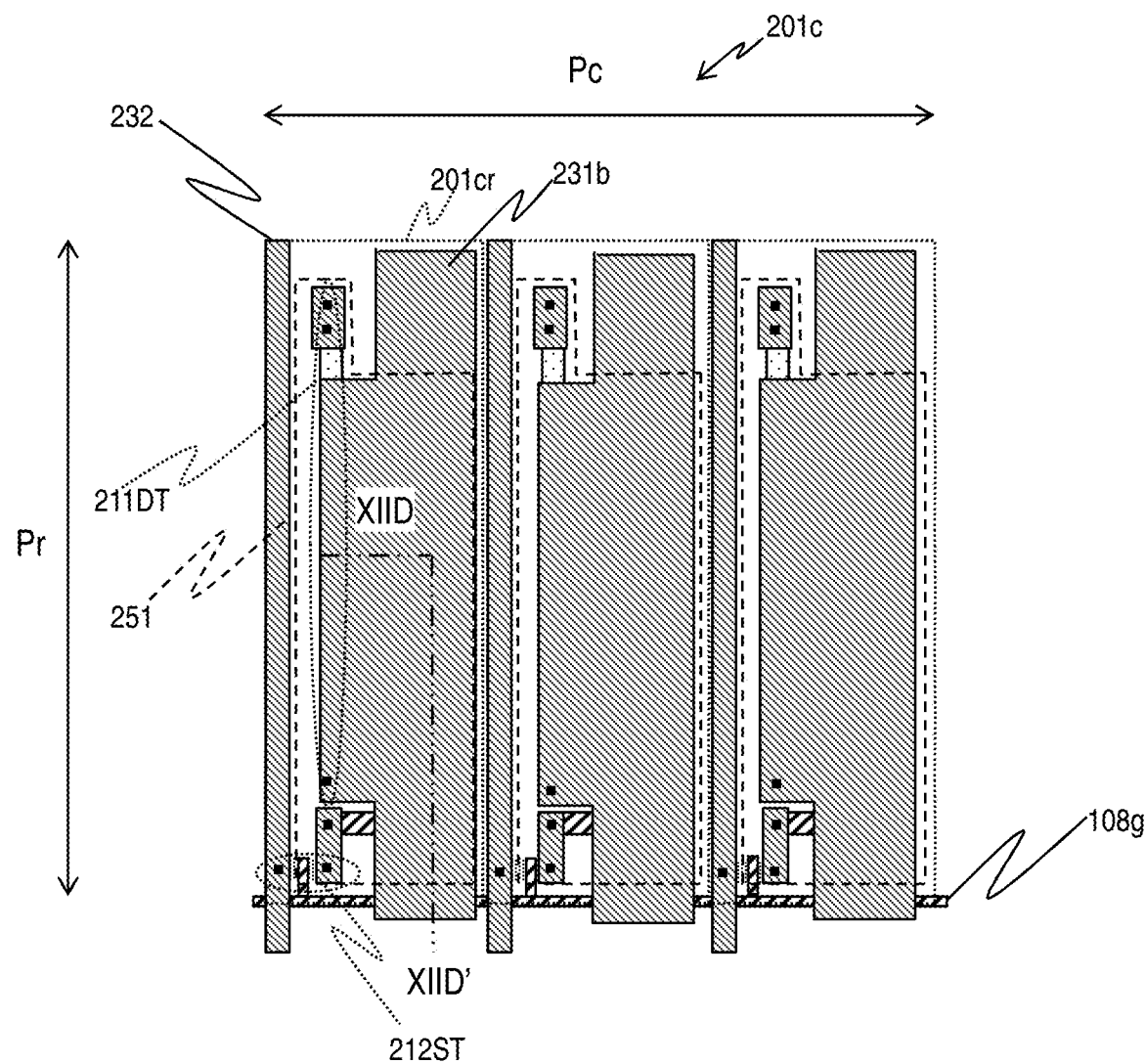
FIG. 12A illustrates a layout of pixel circuits of OLED sub-pixels.

A plurality of pixel circuits are formed on a later-described substrate. FIG. 11 illustrates an equivalent circuit to a pixel circuit and an OLED element E1. FIG. 12A illustrates a layout of pixel circuits of OLED sub-pixels. The pixel circuit is described with reference to FIGS. 11 and 12A. Each pixel circuit (for example, a pixel circuit 201$crc$) includes a driving transistor 211DT, a transistor 212ST for selecting the sub-pixel, and a storage capacitor HC. The pixel circuit controls light emission of an OLED element E1 of the sub-pixel. The transistors are TFTs. FIG. 12A virtually indicates anode electrodes 251 with dashed lines.

In the example of FIG. 11, the selecting transistor 212ST is a p-channel TFT and its gate terminal is connected with a gate line (scanning line) 108$g$. The drain terminal is connected with a data line 232. The source terminal is connected with the gate terminal of the driving transistor 211DT.

The driving transistor 211DT is a transistor (driving TFT) for driving the OLED element E1. The driving transistor 211DT is a p-channel TFT and its gate terminal is connected with the source terminal of the selecting transistor 212ST. The source terminal of the driving transistor 211DT is connected with an OLED power line 231$b$. The drain terminal is connected with the anode of the OLED element E1. The storage capacitor HC is physically provided between the gate terminal and the source terminal of the driving transistor 211DT.

Next, operation of the pixel circuit is described. The scanning circuit block outputs a selection pulse to the gate line 108$g$ to open the selecting transistor 212ST. The data voltage (data signal) supplied from the data circuit block through the data line 232 is stored to the storage capacitor HC. The storage capacitor HC holds the stored voltage during the period of one frame. The conductance of the driving transistor 211DT changes in an analog manner in accordance with the stored voltage, so that the driving transistor 211DT supplies a forward bias current corresponding to a light emission level to the OLED element E1.

Although FIG. 12A illustrates a range in the length of one sub-pixel in the column direction for simplicity of illustration, the OLED power lines 231b and the data lines 232 extend in the column direction as illustrated in FIG. 10A.

Figure 12B:
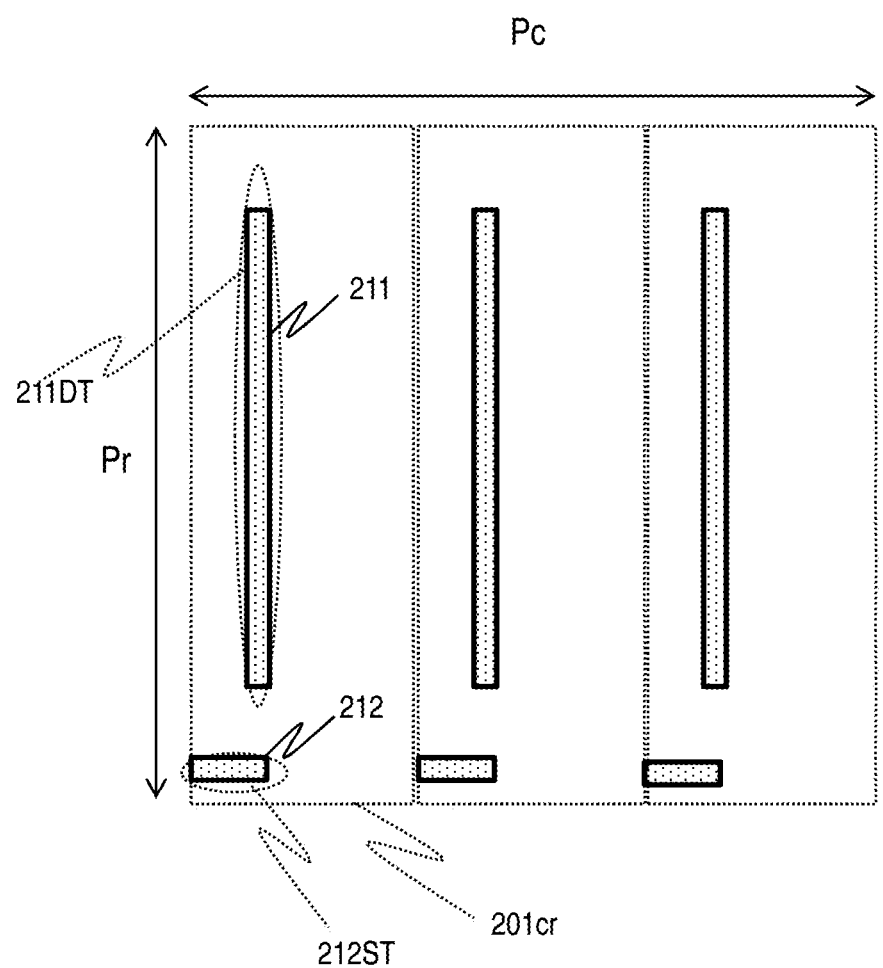
FIG. 12B illustrates a layout (pattern) of a semiconductor layer in the layout illustrated in FIG. 12A.
Figure 12C:
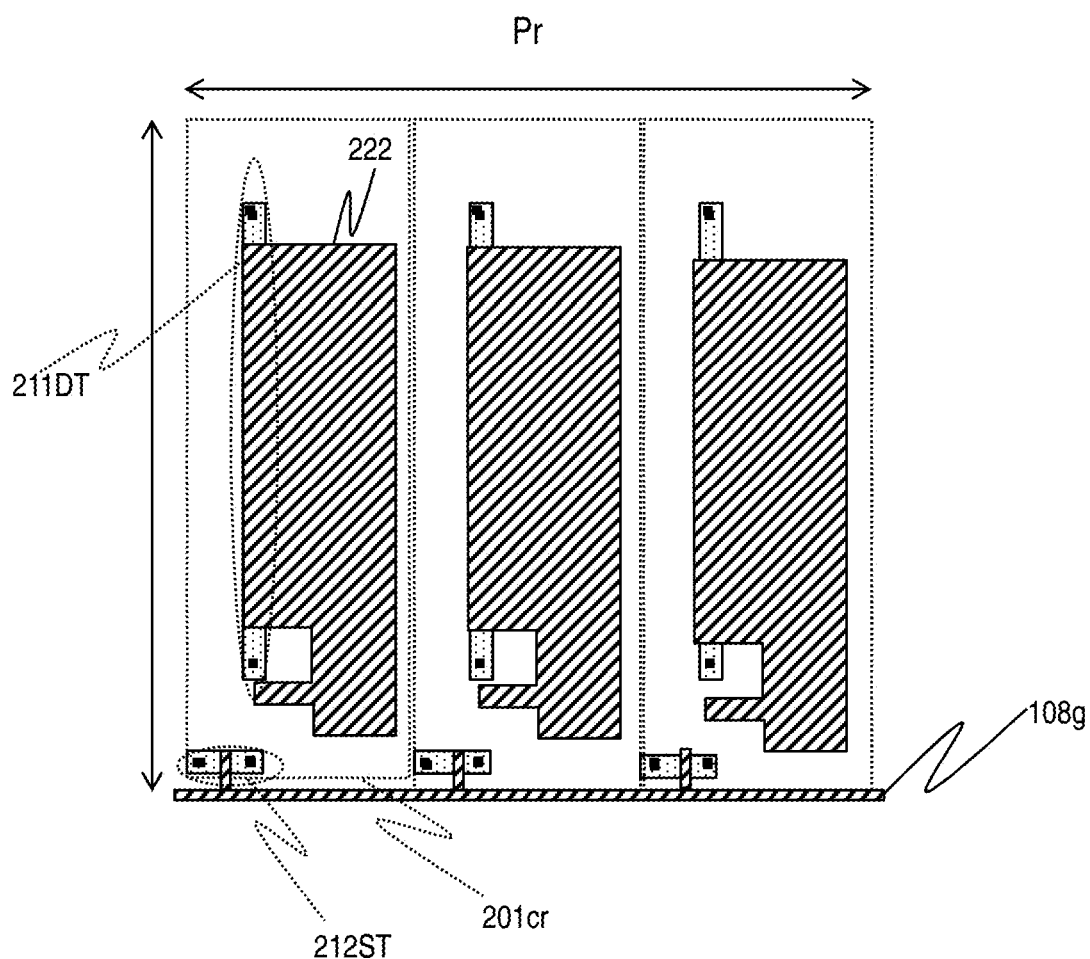
FIG. 12C illustrates a layout excluding the metal layer including OLED power lines from FIG. 12A.
Figure 12D:
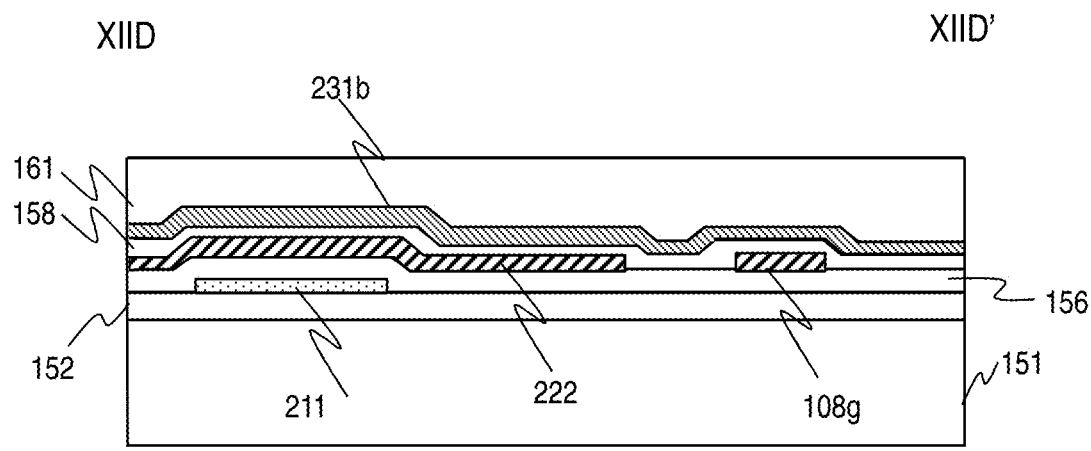
FIG. 12D is a cross-sectional diagram cut along the line XIID-XIID' in FIG. 12A.

FIG. 12B illustrates a layout (pattern) of the semiconductor layer in the layout illustrated in FIG. 12A. FIG. 12C illustrates a layout excluding the metal layer including the OLED power lines 231b from FIG. 12A. FIG. 12D is a cross-sectional diagram cut along the line XIID-XIID' in FIG. 12A.

As illustrated in FIGS. 12B and 12D, a pattern of a semiconductor layer including the channel (semiconductor layer) 212 of the selecting transistor 212ST and the channel 211 of the driving transistor 211DT is formed on the insulating film 152. The channel 211 and the channel 212 are disposed on the same layer (first layer) as the channel 213 of the TFT TR1. Since these elements are included in the pattern of the same layer, high manufacturing efficiency is attained.

As illustrated in FIGS. 12C and 12D, the pattern of the semiconductor layer is covered by the gate insulating film 156. The electrode of the storage capacitor HC, the gate electrode 222 of the driving transistor 211DT, and the pattern of the first metal layer including the scanning line (gate line) 108g are provided on the gate insulating film 156. The electrode of the storage capacitor HC is unseparated from the gate electrode 222.

As illustrated in FIGS. 12A and 12D, a pattern of the second metal layer including the OLED power lines 231b is formed on the interlayer insulating film 158. The OLED power lines 231b are disposed on the same layer (third layer) as the main power line 231a. The interlayer insulating film 158 covers the pattern of the first metal layer and the gate insulating film 156. The pattern of the second metal layer is covered by an uppermost planarization film 161.

Figure 13:
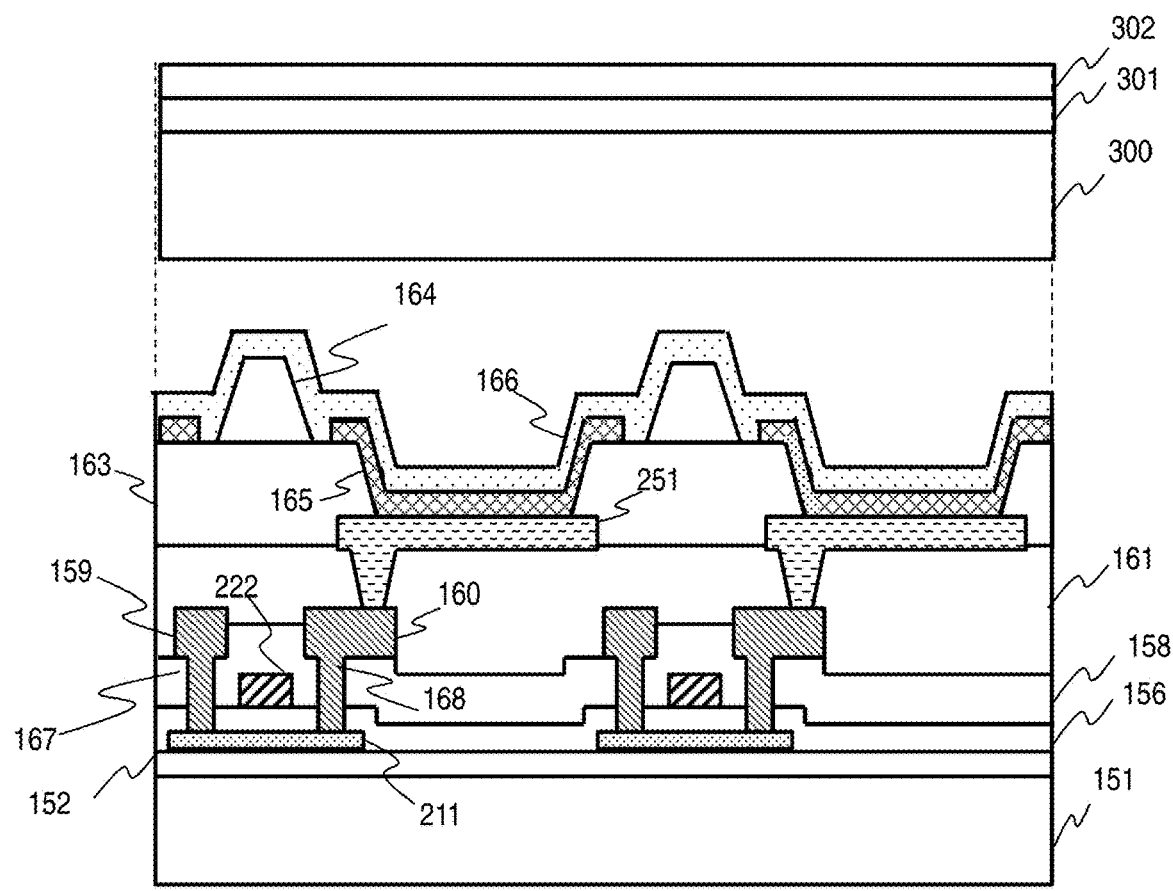
FIG. 13 illustrates an example of a top-emission pixel structure.

FIG. 13 illustrates an example of a top-emission pixel structure. In the top-emission pixel structure, a cathode electrode 166 common to a plurality of pixels is provided on the light emission side (the upper side of the drawing). The cathode electrode 166 has a shape that fully covers the entire display region. The feature of this disclosure is applicable to OLED display devices having a bottom-emission pixel structure. The bottom-emission pixel structure has a transparent anode electrode and a reflective cathode electrode and is configured to emit light toward the lower side of the drawing.

An OLED element is composed of an anode electrode of a lower electrode, an organic light-emitting layer, and a cathode electrode of an upper electrode. That is to say, a plurality of OLED elements are composed of one cathode electrode 166, a plurality of anode electrodes 251, and a plurality of organic light-emitting layers 165.

An insulating substrate 151 is made of glass or resin, for example, and is an inflexible or flexible substrate. In the following description, the side closer to the insulating substrate 151 is referred to as lower side and the side farther from the insulating substrate 151 is referred to as upper side. Gate electrodes 222 are provided above a gate insulating film 156. Above the layer of the gate electrodes 222, an interlayer insulating film 158 is provided.

Within the display region, source electrodes 159 and drain electrodes 160 are provided above the interlayer insulating film 158. The source electrodes 159 and drain electrodes 160 are made of a metal having a high melting point or an alloy of such a metal. The source electrodes 159 and the drain electrodes 160 are connected with a semiconductor layer 211 through contacts 167 and 168 provided in contact holes of the interlayer insulating film 158.

An insulative planarization film 161 is provided over the source electrodes 159 and the drain electrodes 160. Above the insulative planarization film 161, anode electrodes 251 are provided. Each anode electrode 251 is connected with a drain electrode 160 through a contact provided in a contact hole of the planarization film 161. A pixel circuit (see FIG. 11) is formed under the anode electrode 251.

An insulative pixel defining layer (PDL) 163 for isolating OLED elements is provided above the anode electrodes 251. An OLED element is composed of an anode electrode 251, an organic light-emitting layer 165, and a cathode electrode 166 (a part thereof) stacked together.

An insulative spacer 164 is provided on the pixel defining layer 163 between anode electrodes 251. The top face of the spacer 164 is located higher than the top face of the pixel defining layer 163 or closer to the encapsulation substrate 300 and maintains the space between the OLED elements and the encapsulation substrate 300 by supporting the encapsulation substrate 300 when the encapsulation substrate 300 is deformed.

Above an anode electrode 251 and a part of the pixel defining layer 163, an organic light-emitting layer 165 is provided. The cathode electrode 166 is provided over the organic light-emitting layer 165. The cathode electrode 166 is a transparent electrode. The cathode electrode 166 transmits all or part of the visible light from the organic light-emitting layer 165.

The laminated film of the anode electrode 251, the organic light-emitting layer 165, and the cathode electrode 166 corresponds to an OLED element. The cathode electrode 166 is common to the anode electrodes 251 and the organic light-emitting layers 165 (OLED elements) that are formed separately. A not-shown cap layer may be provided over the cathode electrode 166.

The encapsulation substrate 300 is a transparent insulating substrate, which can be made of glass. The encapsulation substrate 300 encapsulates the OLED elements. A λ/4 plate 301 and a polarizing plate 302 are provided over the light emission surface (top face) of the encapsulation substrate 300 to prevent reflection of light entering from the external. Instead of the encapsulation substrate 300, the OLED elements may be encapsulated by thin film encapsulation.

Figure 14:
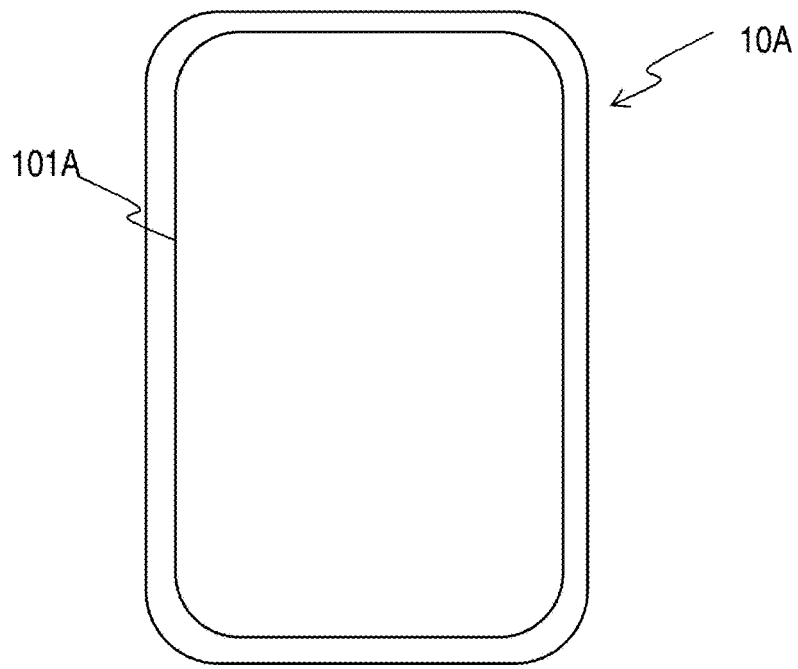
FIG. 14 schematically illustrates another configuration example of a display device.

FIG. 14 schematically illustrates another configuration example of the display device. As another example of the non-rectangular shape, a display device 10A has a display region 101A having straight sides and round corners, as illustrated in FIG. 14.

As set forth above, embodiments of this invention have been described; however, this invention is not limited to the foregoing embodiments. Those skilled in the art can easily modify, add, or convert each element in the foregoing embodiment within the scope of this invention. A part of the configuration of one embodiment may be replaced with a configuration of another embodiment or a configuration of an embodiment may be incorporated into a configuration of another embodiment.

What is claimed is:

1. A display device comprising:
    a display region including a plurality of pixel columns and a plurality of pixel rows;
    a plurality of row circuit blocks and a plurality of column circuit blocks disposed side by side along the boundary of the display region; and
    a first power line configured to supply electric power to pixels in the display region, wherein each of the plurality of row circuit blocks is configured to supply a first signal to a pixel row associated therewith, wherein each of the plurality of column circuit blocks is configured to supply a second signal to a pixel column associated therewith, wherein the perimeter of the display region includes a series of steps each including sides of a plurality of pixels, wherein each step of the series of steps is defined by pixels in m pixel columns and pixels in n pixel rows, n and m each being a variable to take a natural number determined depending on the step, wherein the plurality of column circuit blocks and the plurality of row circuit blocks include a plurality of circuit block units each being opposed to a step of the series of steps, wherein each of the plurality of circuit block units consists of m column circuit blocks and n row circuit blocks disposed side by side along a virtual line connecting outer vertices of an opposite step in an order corresponding to an order of pixel rows and pixel columns of the opposite step, wherein a total sum of lengths of sides of the m column circuit blocks opposed to the virtual line that are projected to the virtual line and lengths of sides of the n row circuit blocks opposed to the virtual line that are projected to the virtual line is equal to or shorter than a length of the virtual line in each circuit block, and wherein the first power line is provided outer than the display region and between the display region and both the plurality of row circuit blocks and the plurality of column circuit blocks.

2. The display device according to claim 1, wherein each of pixel circuits in the display region includes a driving transistor configured to control light to be emitted, wherein each of the plurality of row circuit blocks includes a first control transistor configured to control supply of the first signal, wherein each of the plurality of column circuit blocks includes a second control transistor configured to control supply of the second signal, and wherein channels of the driving transistors and at least either channels of the first control transistors or channels of the second control transistors are provided on a first layer.

3. The display device according to claim 2, further comprising:

first signal lines configured to transmit the first signal from the plurality of row circuit blocks to the associated pixel rows; and second signal lines configured to transmit the second signal from the plurality of column circuit blocks to the associated pixel columns, wherein the first signal lines and the second signal lines are provided outer than the display region and between the display region and both the plurality of row circuit blocks and the plurality of column circuit blocks, and wherein the first signal lines and the second signal lines are provided on a second layer which is different from the first layer and insulated from the first layer with an insulating layer.

4. The display device according to claim 3, wherein each pixel in the display region includes a self-light-emitting element, wherein the display device further comprises second power lines connected with the first power line, each second power line being configured to supply electric current to self-light-emitting elements of pixels of a pixel column disposed in a column direction, and wherein the first power line and the second power lines are provided on a third layer which is different from the first layer and the second layer and insulated from the first layer and the second layer with insulating layers.

5. The display device according to claim 4, wherein the gates of the driving transistors and at least either the gates of the first control transistors or the gates of the second control transistors are disposed on the second layer.

6. The display device according to claim 1, wherein a direction in which a wire configured to supply a control signal for the m column circuit blocks extends, a direction in which a wire configured to supply a control signal for the n row circuit blocks extends, and a direction in which a power line configured to apply potential to the n row circuit blocks extends are parallel to the virtual line.

7. The display device according to claim 1, wherein the m column circuit blocks have the identical shapes, wherein the n row circuit blocks have the identical shapes, and wherein $(mWc+nWr)$ is equal to or less than $((mPc)^2+(nPr)^2)^{1/2}$, where Wc represents a length of the side opposed to the virtual line of each of the m column circuit blocks, Wr represents a length of the side opposed to the virtual line of each of the n row circuit blocks, Pc represents a pitch of the pixel columns, and Pr represents a pitch of the pixel rows.

8. The display device according to claim 7, wherein $(mWc+nWr)=((mPc)^2+(nPr)^2)^{1/2}$.

9. The display device according to claim 1, wherein each of the plurality of circuit blocks is provided outer than the virtual line connecting outer vertices of the opposite step.

10. The display device according to claim 1, wherein dimensions of the m column circuit blocks in a direction of the normal to the virtual line and dimensions of the n row circuit blocks in a direction of the normal to the virtual line are the same.

11. The display device according to claim 1, wherein a total sum of lengths of sides opposed to the virtual line of the m column circuit blocks and lengths of sides opposed to the virtual line of the n column circuit blocks is equal to the length of the virtual line.

12. The display device according to claim 1, wherein, in each of the plurality of circuit block unit, the column circuit blocks have the identical quadrangular shapes and the row circuit blocks have the identical quadrangular shapes.

13. A method of designing a display device, the display device including a display region including a plurality of pixel columns and a plurality of pixel rows, a plurality of row circuit blocks and a plurality of column circuit blocks disposed side by side along the boundary of the display region, and a first power line configured to supply electric power to pixels in the display region, each of the plurality of row circuit blocks being configured to supply a first signal to a pixel row associated therewith, each of the plurality of column circuit blocks being configured to supply a second signal to a pixel column associated therewith, the perimeter of the display region including a series of steps each including sides of a plurality of pixels, each step of the series of steps being defined by pixels in m pixel columns and pixels in n pixel rows, n and m each being a variable to take a natural number determined depending on the step, the plurality of column circuit blocks and the plurality of row circuit blocks including a plurality of circuit block units each being opposed to a step of the series of steps, and the method comprising designing each of the plurality of circuit block units to satisfy the following conditions:

that the circuit block unit consists of m column circuit blocks and n row circuit blocks disposed side by side along a virtual line connecting outer vertices of an opposite step in an order corresponding to an order of pixel rows and pixel columns at the opposite step;

that a total sum of lengths of sides of the m column circuit blocks opposed to the virtual line that are projected to the virtual line and lengths of sides of the n row circuit blocks opposed to the virtual line that are projected to the virtual line is equal to or shorter than a length of the virtual line; and that the first power line is provided outer than the display region and between the display region and the plurality of row circuit blocks and the plurality of column circuit blocks.

14. The method according to claim 13, wherein each of the plurality of circuit block units is designed to satisfy the following conditions:

that the m column circuit blocks have the identical shapes;

that the n row circuit blocks have the identical shapes; and that $(mWc+nWr)$ is equal to or less than $((mPc)^2+(nPr)^2)^{1/2}$, where Wc represents a length of the side opposed to the virtual line of each of the m column circuit blocks, Wr represents a length of the side opposed to the virtual line of each of the n row circuit blocks, Pc represents a pitch of the pixel columns, and Pr represents a pitch of the pixel rows.

15. The method according to claim 14, wherein each of the plurality of circuit block units is designed to satisfy the following conditions:

that all row circuit blocks and column circuit blocks in the plurality of circuit block units have the same length; and that common sizes equal to or smaller than Wc and Wr determined by the following formulae are applied to the plurality of circuit block units:

$Wc=(Pc^2+(\beta Pr)^2)^{1/2}/(1+\alpha\beta)$, and $Wr=\alpha(Pc^2+(\beta Pr)^2)^{1/2}/(1+\alpha\beta)$, where $\alpha=Wr/Wc$, $\beta=n/m=\alpha/k$, and $k=(Pr/Pc)^2$.

* * * * *